(12) United States Patent
Yeon

(10) Patent No.: US 12,288,773 B2
(45) Date of Patent: Apr. 29, 2025

(54) DISPLAY APPARATUS

(71) Applicant: SAMSUNG ELECTRONICS CO., LTD., Suwon-si (KR)

(72) Inventor: Jihye Yeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 403 days.

(21) Appl. No.: 17/720,403

(22) Filed: Apr. 14, 2022

(65) Prior Publication Data

US 2023/0037888 A1     Feb. 9, 2023

(30) Foreign Application Priority Data

Aug. 3, 2021   (KR) .................... 10-2021-0102083

(51) Int. Cl.
| | |
|---|---|
| *H01L 25/075* | (2006.01) |
| *H01L 27/15* | (2006.01) |
| *H01L 33/38* | (2010.01) |
| *H01L 33/40* | (2010.01) |
| *H01L 33/50* | (2010.01) |
| *H01L 33/62* | (2010.01) |

(52) U.S. Cl.
CPC ........ *H01L 25/0753* (2013.01); *H01L 27/156* (2013.01); *H01L 33/387* (2013.01); *H01L 33/405* (2013.01); *H01L 33/50* (2013.01); *H01L 33/62* (2013.01)

(58) Field of Classification Search
CPC . H01L 25/0753; H01L 25/167; H01L 27/156; H01L 33/387; H01L 33/405; H01L 33/50; H01L 33/62; H01L 33/504; H01L 33/08; H01L 33/20; H01L 33/36; H01L 33/44; H01L 33/58; G02B 5/201
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |
| (Continued) | | | |

FOREIGN PATENT DOCUMENTS

| | | | |
|---|---|---|---|
| JP | 2008-262993 A | 10/2008 | |
| KR | 10-2019-0074067 A | 6/2019 | |
| (Continued) | | | |

*Primary Examiner* — Sitaramarao S Yechuri
(74) *Attorney, Agent, or Firm* — Muir Patent Law, PLLC

(57) ABSTRACT

A display apparatus includes a circuit substrate with driving circuits and first bonding electrodes, and a pixel array having LED cells, each of the LED cells including first and second conductivity-type semiconductor layers with an active layer therebetween, second bonding electrodes on the first bonding electrodes, wavelength converters on the LED cells, an upper semiconductor layer on the LED cells and having a partition structure surrounding side snakes of the wavelength converters and separating the wavelength converters, a first reflective electrode on the side surfaces of the LED cells, spaced from the LED cells by a passivation layer, and extending between the LED cells, second reflective electrodes on the lower surfaces of the LED cells and connected to the second conductivity-type semiconductor layers, a common electrode on at least one side of the LED cells, and a pad electrode outside the LED cells and electrically connected to the driving circuits.

19 Claims, 26 Drawing Sheets

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 10,410,998 B2 | 9/2019 | Kim et al. |
| 10,636,349 B2 | 4/2020 | Shin et al. |
| 10,714,001 B2 | 7/2020 | Cok et al. |
| 2015/0362165 A1* | 12/2015 | Chu | H01L 33/32 362/235 |
| 2018/0047780 A1* | 2/2018 | Yeon | H01L 33/504 |
| 2020/0235085 A1 | 7/2020 | Tao et al. |
| 2020/0321390 A1 | 10/2020 | Wu et al. |
| 2020/0349882 A1 | 11/2020 | Kim et al. |
| 2022/0139999 A1 | 5/2022 | Yeon et al. |

FOREIGN PATENT DOCUMENTS

| | | |
|---|---|---|
| KR | 10-2021-0012181 A | 2/2021 |
| KR | 10-2022-0058713 A | 5/2022 |

\* cited by examiner

DISPLAY APPARATUS

CROSS-REFERENCE TO RELATED APPLICATION

This application claims benefit of priority to Korean Patent Application No. 10-2021-0102083 filed on Aug. 3, 2021. in the Korean Intellectual Property Office, the disclosure of which is incorporated herein by reference in its entirety.

BACKGROUND

1. Field

The present disclosure relates to a display apparatus, and more particularly, to a display apparatus having a light emitting diode (LED).

2. Description of the Related Art

A semiconductor light emitting diode (LED) may be used not only as a light source of a lighting device, but also as a light source of various electronic products. In particular, the LED may be widely used as a light source of various display apparatuses. e.g., televisions (TVs), mobile phones, personal computers (PCs), notebook PCs, personal digital assistants (PDAs), and the like.

For example, a display apparatus may include a display panel with a liquid crystal display (LCD) and a separate backlight. In another example, the backlight may not be separate, but instead, may be configured with a LED used as a pixel. Such a display apparatus may be miniaturized, and a high-brightness display apparatus having superior light efficiency may be realized.

SUMMARY

According to an aspect of the present disclosure, a display apparatus may include a circuit substrate having circuits and first bonding electrodes, and a pixel array on the circuit substrate, the pixel array having light emitting diode (LED) cells constituting pixels, each of the LED cells including a first conductivity-type semiconductor layer, an active layer, and a second conductivity-type semiconductor layer, sequentially stacked, second bonding electrodes bonded to the first bonding electrodes, wavelength converters on upper surfaces of the LED cells, an upper semiconductor layer on the LED cells, the upper semiconductor layer having a partition structure surrounding side surfaces of the wavelength converters and separating the wavelength converters from each other, a passivation layer extending from lower surfaces of the LED cells to cover side surfaces of the LED cells, a first reflective electrode on the side surfaces of the LED cells, the first reflective electrode being spaced apart from the LED cells by the passivation layer, extending into a region between the LED cells, second reflective electrodes on the lower surfaces of the LED cells and connected to the second conductivity-type semiconductor layers, respectively, a common electrode on at least one side of the LED cells, and a pad electrode outside the LED cells and electrically connected to the driving circuits.

According to an aspect of the present disclosure, a display apparatus includes a circuit substrate having driving circuits, and a pixel array on the circuit substrate, the pixel array having a plurality of pixels, light emitting diode (LED) cells constituting the plurality of pixels, each of the LED cells including a first conductivity-type semiconductor layer, an active layer, and a second conductivity-type semiconductor layer, sequentially stacked, wavelength converters on upper surfaces of the LED cells, a first reflective electrode extending from side surfaces of the LED cells to an outside of the LED cells, the first reflective electrode extending between facing ones of the side surfaces of adjacent ones of the LED cells and having a grid shape along a region between the adjacent ones of the LED cells, and second reflective electrodes on lower surfaces of the LED cells and connected to the second conductivity-type semiconductor layers, respectively.

According to an aspect of the present disclosure, a display apparatus includes a circuit substrate having driving circuits and first bonding electrodes, and to pixel array on the circuit substrate, the pixel array having light emitting diode (LED) cells constituting a plurality of pixels, each of the LED cells including a first conductivity-type semiconductor layer, an active layer, and a second conductivity-type semiconductor layer, sequentially stacked, a first reflective electrode in a region between adjacent ones of the LED cells without vertically overlapping the LED cells, second reflective electrodes connected to the second conductivity-type semiconductor layers each of the second reflective electrodes being below a lower surface of a corresponding one of he LED cells to vertically overlap the LED cells, wavelength converters on upper surfaces of the LED cells, an upper semiconductor layer having a partition structure surrounding side surfaces of the wavelength converters and separating the wavelength converters from each other, a common electrode on at least one side of the LED cells, and second bonding electrodes bonded to the first bonding electrodes, a first portion of the second bonding electrodes outside the LED cells being connected to the first reflective electrode through the common electrode, and a second portion of the second bonding electrodes being directly connected to the second reflective electrodes.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
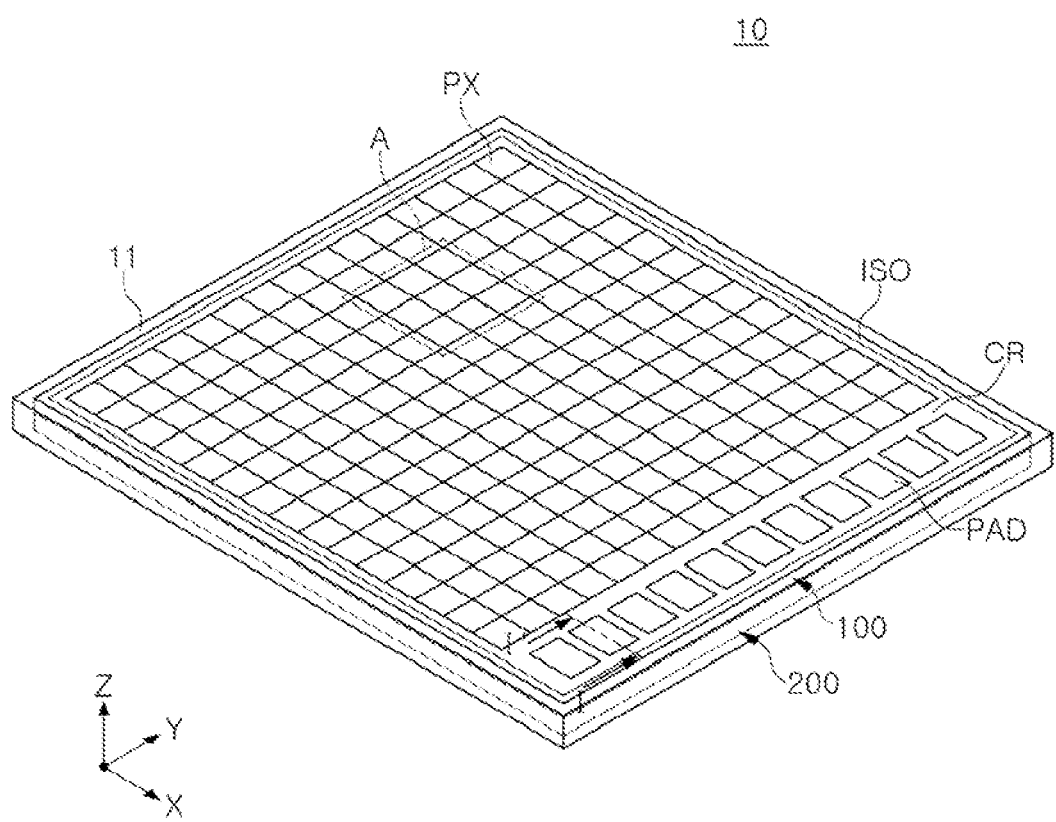
FIG. 1 is a perspective vie display apparatus according to example embodiments.
Figure 2:
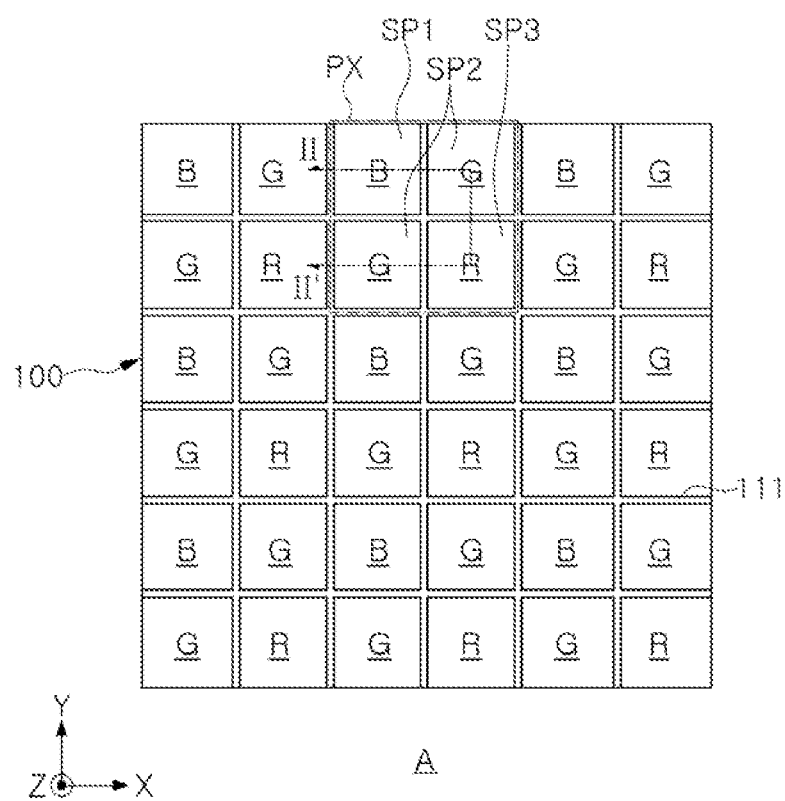
FIG. 2 is a schematic plan view of a display apparatus according to example embodiments.

Hereinafter, example embodiments will be described with reference to the accompanying drawings. FIG. 1 is a perspective view of a display apparatus according to example embodiments. FIG. 2 is an enlarged plan view of portion "A" of FIG. 1.

Unless otherwise specified, in this specification, terms such as 'on,' 'upper,' 'upper portion,' 'upper surface,' 'below,' 'Tower.' 'lower portion,' 'lower surface,' and 'side surface' may be based on the drawings, and depend actually on a direction in which an element is disposed.

Referring to FIGS. 1 and 2, a display apparatus 10 may include a circuit substrate 200 with driving circuits. and a pixel array 100 disposed on the circuit substrate 200 and in which a plurality of pixels PX are arranged, e.g., the plurality of pixels PX may also be referred to as a pixel region PX including the plurality of pixels PX. The display apparatus 10 may further include a frame 11 surrounding the circuit substrate 200 and the pixel array 100.

The circuit substrate 200 may be a driving circuit substrate including thin film transistor (TFT) cells. In some embodiments, the circuit substrate 200 may include only some of the driving circuits for the display apparatus. In this case, the display apparatus 10 may further include other driving devices. In some embodiments, the circuit substrate 200 may implement a display apparatus having a curved profile by including a flexible substrate.

The pixel array 100 may correspond to an LED module for a display. The pixel array 100 may further include connection pads PAD, a connection region CR connecting the plurality of pixels PX and the connection pads PAD, and an edge region ISO, in addition to the plurality of pixels PX.

Each of the plurality of pixels PX may include first to third sub-pixels SP1, SP2, and Sp3 configured to emit light of specific wavelengths, e.g., specific colors, different from each other, to provide a color image. For example, the first to third sub-pixels SP1, SP2, and SP3 may be configured to emit blue (B) light, green (G) light, and red (R) light, respectively. In each pixel PX, the first to third sub-pixels SP1, SP2, and SP3 may be arranged in, e.g., a Bayer pattern. Specifically, each of the pixels PX may include first and third sub-pixels SP1 and SP3 arranged in a first diagonal direction and two second sub-pixels SP2 arranged in a second diagonal direction, intersecting the first diagonal direction.

In FIG. 2, each of the pixels PX is illustrated as having a configuration in which the first to third sub-pixels SP1, SP2, and SP3 are arranged in a 2×2 Bayer pattern, but embodiments are not limited thereto. In other embodiments, each of the pixels PX may be configured in a different arrangement such as 3×3, 4×4, or the like. Also, according to embodiments, some sub-pixels may be configured to emit light having a color different from the illustrated colors (R, G, and B), e.g., yellow light. In the pixel array 100 of FIG. 1, the plurality of pixels PX are illustrated as having a 15×15 arrangement, but the number of columns and rows may be any suitable number, e.g., 1,024×768 or the like may be implemented. For example, the plurality of pixels PX may have a different arrangement according to a desired resolution.

The connection pads PAD may be disposed on at least one side of the plurality of pixels PX along an edge of the display apparatus 10. The connection pads PAD may be electrically connected to the plurality of pixels PX and the driving circuits of the circuit substrate 200. The connection pads PAD may electrically connect an external device and the display apparatus 10. According to embodiments, the number of connection pads PAD may be variously changed, e.g., may be determined according to the number of pixels PX, a driving method of the TFT circuit in the circuit substrate 200, or the like.

The connection region CR may be a region located between the plurality of pixels PX and the connection pads PAD, e.g., a region between the plurality of pixels PX and the connection pads PAD in the X direction of FIG. 1. An interconnection structure electrically connected to the plurality of pixels PX, e.g., a common electrode or the like, may be disposed in the connection region CR, e.g., at least as portion of the common electrode 145 of FIG. 3 may extend in the Y direction of FIG. 1 along the entire length of the pixel array 100 between the pixels PX and the connection pads PAD.

The edge region ISO may be a region along edges of the pixel array 100. The edge region ISO may be a region in which an upper semiconductor layer 111 is not disposed, as will be described below with reference to FIG. 3.

The frame 11 may be disposed around the pixel array 100 to serve as a guide for defining an arrangement space of the pixel array 100. The frame 11 may include at least one of, e.g., a polymer, a ceramic, a semiconductor, or a metal. For example, the frame 11 may include a black matrix. The frame 11 is not limited to the black matrix and may include a white matrix or as structure having a different color depending on a purpose of the display apparatus 10. For example, the white matrix may include a reflective material or a scattering material. Although the display apparatus 10 is illustrated as having a rectangular planar structure in FIG. 1, the display apparatus 10 may have a different shape according to embodiments.

Figure 3:
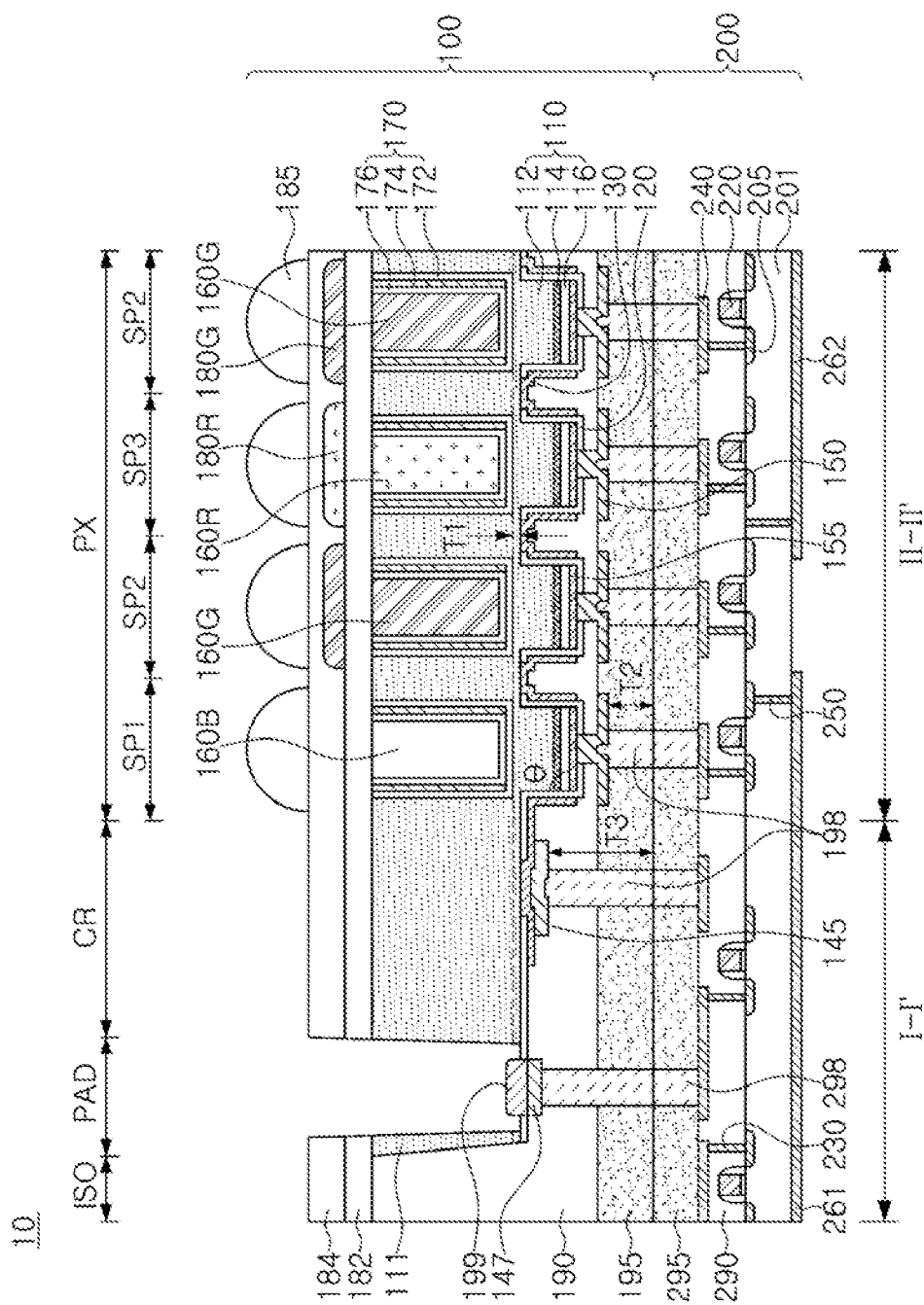
FIG. 3 is a cross-sectional view along line I-I' of FIG. 1 and line II-II' of FIG. 2, according to example embodiments.

FIG. 3 is a cross-sectional view schematically illustrating a display apparatus according to example embodiments. FIG. 3 illustrates a cross-section of FIG. 1, taken along I-I', and a cross-section of FIG. 2, taken along II-II'.

Figure 4:
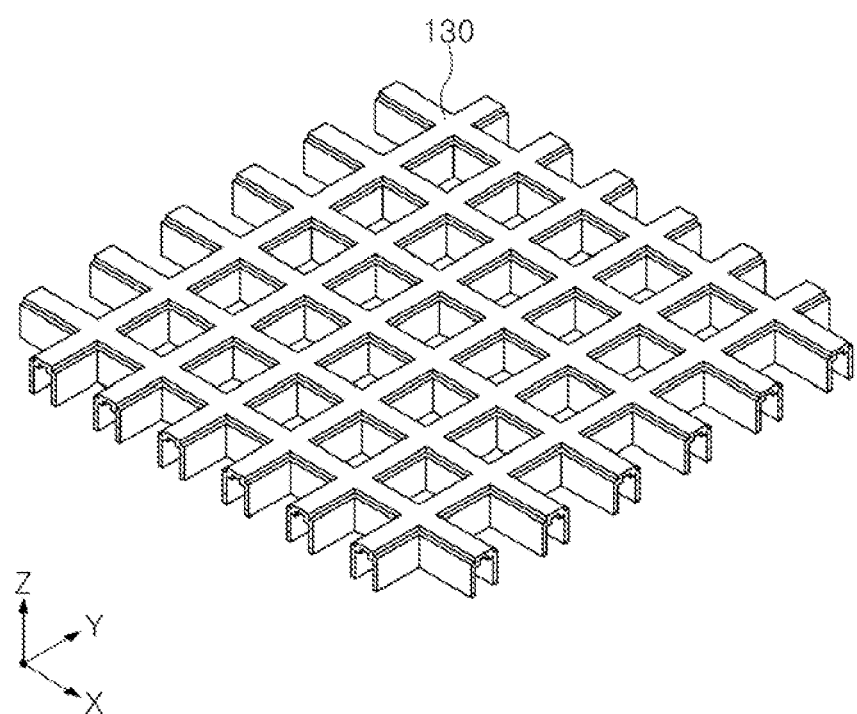
FIG. 4 is a perspective view of a first reflective electrode of a display apparatus according to example embodiments.

FIG. 4 is a perspective view schematically illustrating a first reflective electrode of a display apparatus according to example embodiments.

Referring to FIG. 3, the display apparatus 10 may include the circuit substrate 200 and the pixel array 100 disposed on the circuit substrate 200.

The circuit substrate 200 may include a semiconductor substrate 201, a driving circuit including driving elements 220 with the TFT cells formed on the semiconductor substrate 201, connection portions 230 electrically connected to the driving elements 220, interconnection lines 240 on the connection portions 230 and a circuit insulating layer 290 covering the driving circuit. The circuit substrate 200 may further include a first bonding insulating layer 295 on the circuit insulating layer 290, and first bonding electrodes 298 disposed in the first bonding insulating layer 295 and connected to the interconnection lines 240.

The semiconductor substrate 201 may include impurity regions with source/drain regions 205. For example, the semiconductor substrate 201 may include a semiconductor, e.g., silicon (Si) or germanium (Ge), or a compound semiconductor, e.g., SiGe, SiC, GaAs, InAs, or InP. The semiconductor substrate 201 may further include through-electrodes 250, e.g., a through-silicon via (TSV), connected to the driving circuit, and first and second substrate interconnection lines 261 and 262 connected to the through-electrodes 250.

The driving circuit may include a circuit for controlling driving of a pixel, e.g., a sub-pixel. For example, a source region of the source/drain regions 205 of the TFT cells may be electrically connected to an electrode of light emitting diode (LED) cells 110 through the connection portion 230, the interconnection line 240, and the first bonding electrode 298. For example, a drain region of the source/drain regions 205 of the TFT cells may be connected to the first substrate interconnection line 261 through the through-electrode 250, and the first substrate interconnection line 261 may be connected to a data line. Gate electrodes of the TFT cells may be connected to the second substrate interconnection line 262 through the through-electrode 250, and the second substrate interconnection line 262 may be connected to a gate line. Such a circuit configuration and operation will be described in more detail with reference to FIG. 5 below.

Upper surfaces of the first bonding electrodes 298 and upper surfaces of the first bonding insulating layer 295 may constitute an upper surface of the circuit substrate 200. The first bonding electrodes 298 may be bonded to second bonding electrodes 198 of the pixel array 100 to provide an electrical connection path. The first bonding electrodes 298 may include a conductive material, e.g., copper (Cu). The first bonding insulating layer 295 may be bonded to a second bonding insulating layer 195 of the pixel array 100. The first bonding insulating layer 295 may include, e.g., at least one of SiO, SiN, SiCN, SiOC, SiON, or SiOCN.

The pixel array 100 may include an upper semiconductor layer 111, the LED cells 110 on a lower surface of the upper semiconductor layer 111, a passivation layer 120 covering side surfaces of the LED cells 110, first and second reflective electrodes 130 and 150 connected to the LED cells 110, wavelength converters 160R, 160G, and 160B on the LED cells 110, color filters 180R, 180G, and microlenses 185. The pixel array 100 may further include contact layers 155 on lower surfaces of the LED cells 110, partition reflective layers 170 surrounding side and lower surfaces of the wavelength converters 160R, 160G, and 160B, an encapsulation layer 182 and a planarization layer 184 on the wavelength converters 160R, 160G, and 160B, a common electrode 145, a first pad electrode 147, an interconnection insulating layer 190, the second bonding insulating layer 195, the second bonding electrodes 198, and a second pad electrode 199.

The upper semiconductor layer 111 may be disposed on the LED cells 110. In the pixels PX, the upper semiconductor layer 111 may surround the side surfaces of the wavelength converters 160R, 160G, and 160B, and may have a partition structure, e.g., completely, separating the wavelength converters 160R, 160G, and 160B from each other. For example, as illustrated in FIGS. 2-3, the upper semiconductor layer 111 may have a grid structure to completely surround a perimeter of each of the wavelength converters 160R, 160G, and 160B, as viewed in a top view (FIG. 2). Due to the partition structure of the upper semiconductor layer 111, light emitted from the LED cells 110 may be emitted through the wavelength converters 160R, 160G, and 160B without interfering with each other. The upper semiconductor layer 111 may have side surfaces perpendicular to or inclined in the Z direction between the wavelength converters 160R, 160G, and 160B. For example, in some embodiments, the upper semiconductor layer 111 may have side surfaces inclined to narrow a width of an upper portion, compared to a width of a lower portion. The upper semiconductor layer 111 may be disposed to extend in the connection region CR to form a continuous layer, rather than a partition structure, and may extend, e.g., onto the common electrode 145. The upper semiconductor layer 111 may be disposed in the connection pad PAD to have a configuration in which at least a portion is removed, and may not be disposed in the edge region ISO.

The upper semiconductor layer 111 may include a region integrated or continued with a first conductivity type semiconductor layer 112 of the LED cells 110. The upper semiconductor layer 111 may be a layer grown during a growth process of the LED cells 110. For example, the upper semiconductor layer 111 may include the same material as the first conductivity-type semiconductor layer 112, e.g., at least in a region adjacent to the first conductivity-type semiconductor layer 112. For example, the upper semiconductor layer 111 may include an undoped layer and a doped layer. For example, the upper semiconductor layer 111 may include an epitaxial nitride semiconductor layer. An interface between the upper semiconductor layer 111 and the first conductivity-type semiconductor layer 112 may not be distinguished. However, the upper semiconductor layer 111 and the first conductivity-type semiconductor layer 112 may be substantially distinguished and recognized by positions of lower surfaces of the partition reflective layers 170.

The LED cells 110 may constitute the plurality of pixels PX. e.g., each of the LED cells 110 may respectively constitute a corresponding one of the first to third sub-pixels SP1, SP2, and SP3, and may respectively constitute a micro LED. The LED cells 110 may be arranged in columns and rows. The LED cells 110 may generate blue light, e.g., light having a wavelength of 435 nm to 460 nm. Each of the LED cells 110 may include the first conductivity-type semiconductor layer 112, an active layer 114, and a second conductivity-type semiconductor layer 116, sequentially stacked on the lower surface of the upper semiconductor layer 111.

First conductivity-type semiconductor layers 112 may be disposed to extend upper regions thereof from the pixel PX to the connection region CR and a portion of the connection pad PAD along the upper semiconductor layer 111, e.g., an imaginary interface between the first conductivity-type semiconductor layers 112 and the upper semiconductor layer 111 is indicated with a dashed line in FIG. 3. The first conductivity-type semiconductor layers 112 may be connected to each other by the upper regions between the first to third sub-pixels SP1, SP2, and SP3, to be disposed as one layer, i.e., a single layer, and may also be connected between the pixels PX to be disposed as one layer, e.g., as one continuous and interconnected layer. A thickness T1 of each of the upper regions of the first conductivity-type semiconductor layers 112 may be, e.g., in a range of about 0.1 μm to about 1.0 μm. The active layers 114 and the second conductivity-type semiconductor layers 116 may be disposed only in the pixel PX, and may be disposed between the LED cells 110 to be separated and spaced apart from each other. For example, as illustrated in FIG. 3, the active layers 114 and the second conductivity-type semiconductor layers 116 of adjacent LED cells 110 may be, e.g., completely, separated and spaced apart from each other. In this specification, although the first conductivity-type semiconductor layers 112 are disposed between the LED cells 110 to be connected to each other, each of the LED cells 110 may be defined separately by side surfaces of the active layers 114 and side surfaces of the second conductivity-type semiconductor layers 116. Therefore in the first conductivity type semiconductor layers 112, the first conductivity-type semiconductor layers 112 of the LED cells 110 may be described as being connected to each other.

The first conductivity-type semiconductor layer 112, the active layer 114, and the second conductivity-type semiconductor layer 116 may be formed of a nitride semiconductor, and may be an epitaxial layer. The first conductivity-type semiconductor layer 112 and the second conductivity-type semiconductor layer 116 may be respectively N-type and P-type nitride semiconductor layers having a composition of $In_xAl_yGa_{1-x-y}N$ $0 \le x<1$, $0 \le y<1$, $0 \le x+y<1$). For example. the first conductivity-type semiconductor layer 112 In ay be an N-type gallium nitride (n-GaN) layer doped with silicon (Si), germanium. (Ge), or carbon (C), and the second conductivity-type semiconductor layer 116 may be a P-type gallium nitride (p-GaN) layer doped with magnesium (Mg) or zinc (Zn). In some embodiments, the first conductivity-type semiconductor layer 112 and the second conductivity-type semiconductor layer 116 may be formed of an aluminum indium gallium phosphide (AlInGaP)-based semiconductor or an aluminum indium gallium arsenide (AlInGaAs)-based semiconductor, in addition to the nitride semiconductor. Each of the first conductivity-type semiconductor layer 112 and the second conductivity-type semiconductor layer 116 may be formed as a single layer, or may include a plurality of layers having different characteristics, e.g., a doping concentration, a composition, or the like.

The active layer 114 may emit light having a predetermined energy by the recombination of electrons and holes. The active layer 114 may have a single (SQW) structure or a multiple quantum well (MQW) structure, in which quantum barrier layers and quantum well layers are alternately disposed with each other. For example, the quantum well layer and the quantum barrier layer may be an $In_xAl_yGa_{1-x-y}N$ ($0 \le x \le 1$, $0 \le y \le 1$, $0 \le x+y \le 1$) layer having different compositions. For example, the quantum well layer may be an $In_xGa_{1-x}N(0<x \le 1)$ layer, and the quantum barrier layer may be a GaN layer or an AlGaN layer.

In each of the LED cells 110, an angle θ between the lower surface and the side surfaces thereof may be a right angle or an angle similar to the right angle. For example, the angle θ may range from about 85 degrees to about 95 degrees. The LED cells 110 may have such a structure by sequentially performing a dry etching process and a wet etching process, as will be described below with reference to FIG. 9C.

The passivation layer 120 may cover the side surfaces and a portion of the lower surfaces of the LED cells 110, and may extend to the connection region CR and the connection pad PAD. The passivation layer 120 may be disposed to cover the lower surface of the first conductivity-type semiconductor layer 112 in the connection region CR and the connection pod PAD. The passivation layer 120 may include an insulating material, e.g., at least one of $SiO_2$, SiN, SiCN, SiOC, SiON, or SiOCN.

The first reflective electrode 130 may be connected to the first conductivity-type semiconductor layer 112. In detail, the first reflective electrode 130 may be disposed on the side surfaces of the LED cell 110 to be spaced apart by the LED cell 110 and the passivation layer 120, and may extend to an outside of the LED cell 110. The first reflective electrode 130 extending outwardly may be connected in regions between the adjacent LED cells 110 to be disposed as a single layer, e.g., the first reflective electrode 130 may directly contact the first conductivity-type semiconductor layer 112 in a region between adjacent LED cells 110 that is exposed by the passivation layer 120. The first reflective electrode 130 may, e.g., continuously, extend from one side surface of one LED cell 110 to an opposite side surface of an adjacent LED cell 110. The first reflective electrode 130 may be disposed in an inverted U-shape between adjacent LED cells 110, e.g., the first reflective electrode 130 may have an inverted U-shape cross-section in a region between adjacent LED cells 110.

Referring to FIG. 4, the first reflective electrode 130 may include lines, e.g., linear portions, extending, e.g., continuously, along regions between the pixels PX and the first to third sub-pixels SP1, SP2, and SP3 in the X and Y directions (e.g., corresponding to solid grid lines in FIG. 1). For example, as illustrated in FIG. 4, the first reflective electrode 130 may be a single electrode having a grid shape with a top surface that is substantially flat, while each line of the grid may have an inverted U-shape cross-section. For example, referring to FIGS. 3 and 4, each inverted U-shaped line of the grid (FIG. 4) may extend between adjacent LED cells 110 (FIG. 3), such that sides of the inverted U-shaped line may contact facing sidewalls of the adjacent LED cells 110, e.g., may contact the facing sidewalls via the passivation layer 120 (FIG. 3). The lines of the reflective electrode 130 may extend along boundaries of the LED cells 110, e.g., so a perimeter of each of the LED cells 110 may be completely surrounded by the grid shape of the first reflective electrode 130. The first reflective electrode 130 may have a grid shape or a mesh shape, e.g., continuously overlapping the entire pixel array 100, by connecting the lines to each other, e.g., as viewed in a top view. In the first reflective electrode 130, an outermost line extending from one side of the LED cell 110 and arranged to have a linear shape may be further disposed on an outermost side of the lines, and the outermost line may be connected to the common electrode 145, as illustrated in FIG. 3.

The first reflective electrode 130 may be electrically connected to the first conductivity-type semiconductor layer 112 in a region between the LED cells 110. For example, a region in which the first reflective electrode 130 is in contact with the first conductivity-type semiconductor layer 112 may be a region overlapping the partition structure of the upper semiconductor layer 111. For example, the first reflective electrode 130 may be disposed not to overlap the LED cells 110, e.g., not to overlap the active layer 114 and the second conductivity-type semiconductor layer 116, in the Z direction. Also, the first reflective electrode 130 may be disposed not to overlap the wavelength converters 160R, 160G, and 160B, in the Z direction. The first reflective electrode 130 may extend from an outermost portion of the pixels PX to the connection region CR, may be connected to the first conductivity type semiconductor layer 112, and may be physically and electrically connected to the common electrode 145. Lines constituting the first reflective electrode 130 may be connected to the common electrode 145 in end portions thereof.

The first reflective electrode 130 may include at least one metal, e.g., silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), or gold (Au). In some embodiments, the first reflective electrode 130 may be formed as a monolayer structure or a multi layer structure having a conductive material.

The contact layers 155 and the second reflective electrodes 150 may be sequentially arranged on lower surfaces, e.g., which face the circuit substrate 200, of the second conductivity-type semiconductor layers 116, e.g., to be connected to the second conductivity-type semiconductor layers 116. The contact layer 155 may be disposed to entirely cover a lower surface of the second conductivity-type semiconductor layer 116. The second reflective electrode 150 may be disposed below each of the LED cells 110 to overlap the LED cells 110 in the Z direction. The second reflective electrode 150 may be disposed below the contact layer 155 to be connected to the contact layer 155. A length of the second reflective electrode 150 may be identical or similar to a length of the LED cells 110 in the X direction, but also may be variously changed in embodiments. In some embodiments, the second reflective electrodes 150 may be omitted, e.g., so the contact layers 155 may be directly connected to the second bonding electrodes 198 below the contact layers 155. The contact layers 155 and the second reflective electrodes 150 may include, e.g., a highly reflective metal, and at least one of e.g., silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), or gold (Au).

The wavelength converters 160R, 160G, and 160B, may be respectively disposed on the LED cells 110. Each of the wavelength converters 160R, 160G, and 160B may be a region in which a wavelength conversion material, e.g., a quantum dot, is dispersed in a liquid binder resin and is filled and cured in the partition structure of the upper semiconductor layer 111. Quantum dots for respectively converting blue light into red light and green light may be included in a first wavelength converter 160R and a second wavelength converter 160G, and only a binder resin, without quantum dots, may be included in a third wavelength converter 160B, to constitute a transparent resin portion.

The partition reflective layers 170 may be disposed to surround the side and lower surfaces of the wavelength converters 160R, 160G, and 160B, in the partition structure of the upper semiconductor layer 111. The partition reflective layers 170 may each include a first partition insulating layer 172, a partition metal layer 174, and a second partition insulating layer 176, sequentially disposed from the bottom. The partition metal layer 174 may be disposed only on the side surfaces of the wavelength converters 160R, 160G, and 160B, and may not be disposed below the lower surfaces of the wavelength converters 160R, 160G, and 160B. Lower surfaces of the partition reflective layers 170 may be located at a higher level than an uppermost surface of the first reflective electrode 130. The first partition insulating layer 172 and the second partition insulating layer 176 may include an insulating material, e.g., at least one of $SiO_2$, SiN, SiCN, SiOC, SiON, or SiOCN. The partition metal layer 174 may include a reflective metal, e.g., at least one of silver (Ag), nickel (Ni), or aluminum (Al).

The encapsulation layer 182 may be disposed to cover upper surfaces of the wavelength converters 160R, 160G, and 160B. The encapsulation layer 182 may function as a protective layer preventing deterioration of the wavelength converters 160R, 160G, and 160B. In some embodiments, the encapsulation layer 182 may be omitted.

The color filters 180R and 180G may be disposed on the wavelength converters 160R, 160G, and 160B in the second and third sub-pixels SP2 and SP3. The color filters 180R and 180G may increase color purity of light emitted through the first wavelength converter 160R and the second wavelength converter 160G. In some embodiments, a color filter may be further disposed on the third wavelength converter 160B.

The planarization layer 184 may be disposed to cover upper surfaces of the color filters 180R and 180G and an upper surface of the encapsulation layer 182. The planarization layer 184 may be a transparent layer.

The microlenses 185 may be disposed on the planarization layer 184 to correspond to the wavelength converters 160R, 160G, and 160B, respectively. The microlenses 185 may collect light incident from the wavelength converters 160R, 160G, and 160B. For example, the microlenses 185 may have a diameter greater than a width of each of the LED cells 110 in the X and Y directions. The microlenses 185 may be formed of, e.g., a transparent photoresist material or a transparent thermosetting resin.

The common electrode 145 and the first pad electrode 147 may be arranged in the connection region CR and the connection pad PAD, respectively. The common electrode 145 may be disposed on a lower surface of the first reflective electrode 130 extending from the pixel PX, to connect the first reflective electrode 130 to the second bonding electrode 198. The common electrode 145 may constitute a common electrode structure, together with the first reflective electrode 130. The common electrode 145 may be disposed to have a rectangular ring shape or a ring shape, to entirely surround the pixel PX in a plan view, and may be connected to end portions of the first reflective electrode 130 (e.g., FIG. 4). An arrangement of the common electrode 145 is not limited thereto, and may be variously changed in embodiments. The first pad electrode 147 may be disposed below the second pad electrode 199 in the connection pad PAD, to connect the second pad electrode 199 and the second bonding electrode 198. The common electrode 145 and the first pad electrode 147 may include at least one conductive material, e.g., silver (Ag), nickel (Ni), aluminum (Al), chromium (Cr), rhodium (Rh), iridium (Ir), palladium (Pd), ruthenium (RU), magnesium (Mg), zinc (Zn), platinum (Pt), or gold (Au).

The second pad electrode 199 may be disposed on the first pad electrode 147 in the connection pad PAD. The second pad electrode 199 may be disposed to at least expose an upper surface thereof in an upward direction by an opening passing through the upper semiconductor layer 111 and the first conductivity type semiconductor layer 112. The second pad electrode 199 may be connected to an external device, e.g., an external circuit for applying an electrical signal to the circuit substrate 200 or the like, by wire bonding or anisotropic conductive film (AFC) bonding. The second pad electrode 199 may electrically connect the driving circuits of the circuit substrate 200 and the external device. The second pad electrode 199 may include a metal, e.g., gold (Au), silver (Ag), nickel (Ni). or the like.

The second bonding electrodes 198 may connect the second reflective electrodes 150, the common electrode 145, and the first pad electrode 147, to the first bonding electrodes 298 of the circuit substrate 200. The second bonding electrodes 198 may be connected to the second reflective electrodes 150 below the second reflective electrodes 150 in the pixel PX, may be connected to the common electrode 145 in the connection region CR, and may be connected to the first pad electrode 147 in the connection pad PAD. Among the second bonding electrodes 198, a second bonding electrode 198 connected to the second reflective electrodes 150 may have a second thickness T2 or a second height, e.g., in the Z direction, and a second bonding electrode 198 connected to the common electrode 145 and the first pad electrode 147 may have a third thickness T3 or a third height, e.g., in the Z direction, greater than the second thickness T2. The first reflective electrode 130 may be connected to the second bonding electrodes 198 through the common electrode 145, and the second reflective electrodes 150 may be directly connected to the second bonding electrodes 198.

The second bonding electrodes 198 may be disposed to pass through the interconnection insulating layer 190 and the second bonding insulating layer 195. The second bonding electrodes 198 may have a pillar shape, e.g., a cylinder shape or the like. According to embodiments, the second. bonding electrodes 198 may have sidewalls inclined to decrease a size of an upper surface thereof relative to a size of a lower surface thereof. The second bonding electrodes 198 may include, e.g., copper (Cu). The second bonding electrodes 198 may further include a barrier metal layer, e.g., a tantalum (Ta) layer and/or a tantalum nitride (TaN) layer, on upper and side surfaces thereof.

The interconnection insulating layer 190, together with the second bonding insulating layer 195, may be disposed below the LED cells 110 and the upper semiconductor layer 111. The interconnection insulating layer 190 may include silicon oxide or a silicon oxide-based insulating material, e.g., tetraethyl ortho silicate (TEOS), undoped silicate glass (USG), phosphosilicate glass (PSG), borosilicate glass (BSG), borophosphosilicate glass (BPSG), fluoride silicate glass (FSG), spin on glass (SOG), Tonen Silazane (TOSZ), or a combination thereof.

Lower surfaces of the second bonding insulating layer 195 may be disposed together with lower surfaces of the second bonding electrodes 198 to constitute a lower surface of the pixel array 100. The second bonding insulating layer 195 may constitute dielectric-dielectric bonding with the first bonding insulating layer 295. The circuit substrate 200 and the pixel array 100 may be bonded by bonding the first bonding electrodes 298 and the second bonding electrodes 198, and by bonding the first bonding insulating layer 295 and the second bonding insulating layer 195. The bonding of the first bonding electrodes 298 and the second bonding electrodes 198 may be, e.g., copper (Cu)-to-copper (Cu) bonding, and the bonding of the first bonding insulating layer 295 and the second bonding insulating layer 195 may be, e.g., dielectric-to-dielectric bonding such as SiCN-SiCN bonding. The circuit substrate 200 and the pixel array 100 may be bonded by hybrid bonding including the copper (Cu)-to-copper (Cu) bonding and the dielectric-to-dielectric bonding, and may be bonded without an adhesive layer.

A display apparatus 10 according to this embodiment may optimize arrangement of electrode structures including the first reflective electrode 130, and may bond the circuit substrate 200 and the pixel array 100 using hybrid bonding, to implement a miniaturized, high-resolution device.

Figure 5:
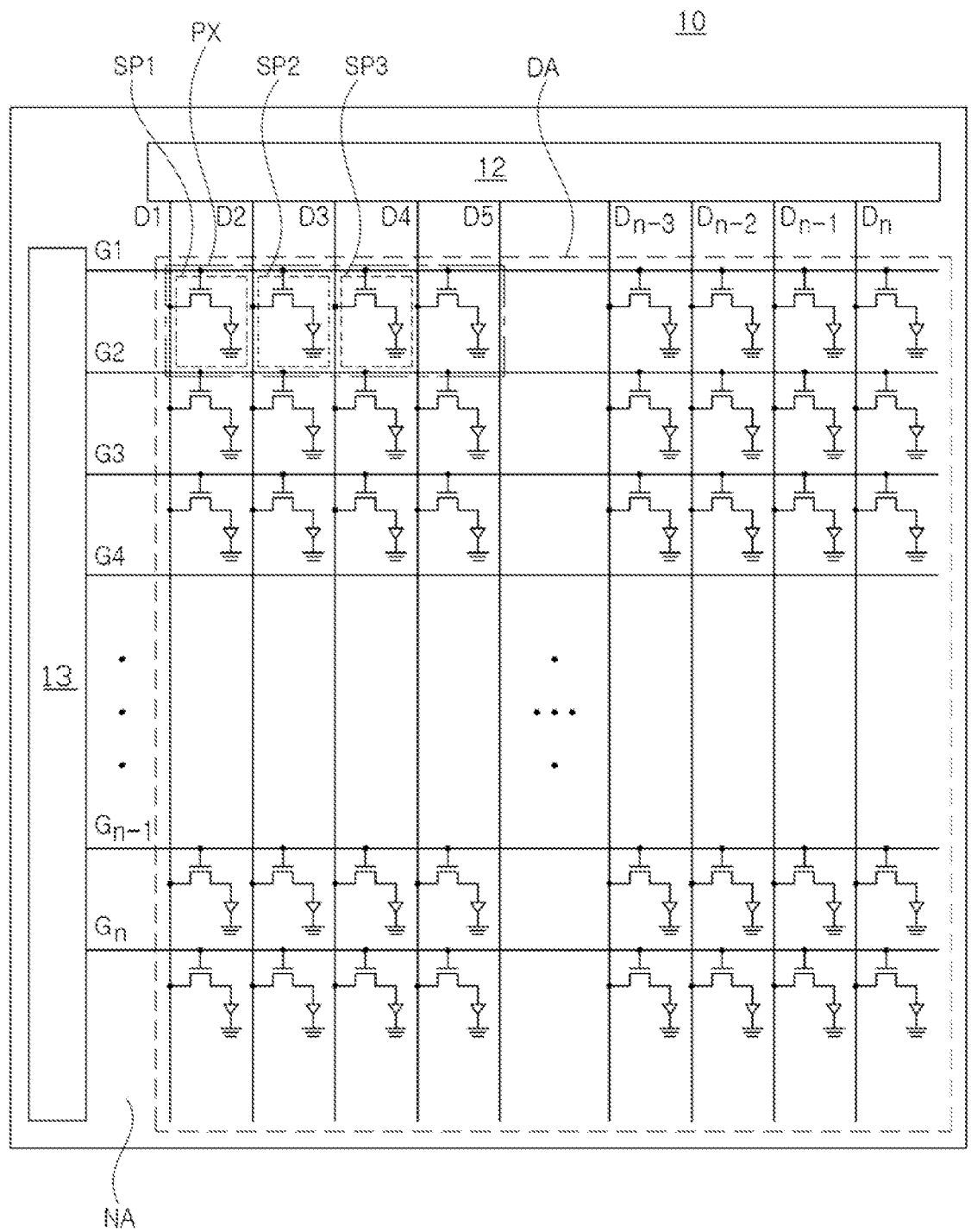
FIG. 5 is a driving circuit implemented in as display apparatus according to example embodiments.

FIG. 5 is a driving circuit implemented in the display apparatus according to example embodiments.

Referring to FIG. 5, a circuit diagram of the display apparatus 10 in which n×n sub-pixels are arranged is illustrated. First to third sub-pixels SP1, SP2, and SP3 may receive data signals through data lines D1 to Dn that may be paths in a vertical direction of FIG. 5, e.g., in a column direction, respectively. The first to third sub-pixels SP1, SP2, and SP3 may receive a control signal, e.g., a gate signal, through gate lines G1 to Gn that may be paths in a horizontal direction of FIG. 5, e.g., in a row direction.

The plurality of pixels PX including the first to third sub-pixels SP1, SP2, and SP3 may provide an active region DA for a display, and the active region DA may be provided as a display region for a user. A non-active region NA may be formed along at least one edge of the active region DA. The non-active region NA may extend along a peripheral portion of a panel of the display apparatus 10, may be a region in which the pixels PX do not exist, and may correspond to the frame 11 (FIG. 1) of the display apparatus 10.

First and second driver circuits 12 and 13 may be employed to control operations of the pixels PX, e.g., the first to third sub-pixels SP1, SP2, and SP3. Some or all of the first and second driver circuits 12 and 13 may be implemented on the circuit substrate 200. The first and second driver circuits 12 and 13 may be formed of e.g., an integrated circuit, a thin film transistor panel circuit, or other suitable circuit, and may be disposed in the non-active region NA of the display apparatus 10. The first and second driver circuits 12 and 13 may include, e.g., a microprocessor, a memory such as a storage unit, a processing circuit, and a communication circuit.

To display an image with the pixels PX, the first driver circuit 12 supplies image data to the data lines D1 to Dn, while providing a clock signal and other control signals to the second driver circuit 13 which may be a gate driver circuit. The second driver circuit 13 may be implemented using an integrated circuit and/or a thin film transistor circuit. The gate signal for controlling the first to third sub-pixels SP1, SP2, and SP3 arranged in the row direction may be transmitted through the gate lines G1 to Gn of the display apparatus 10.

Figure 6:
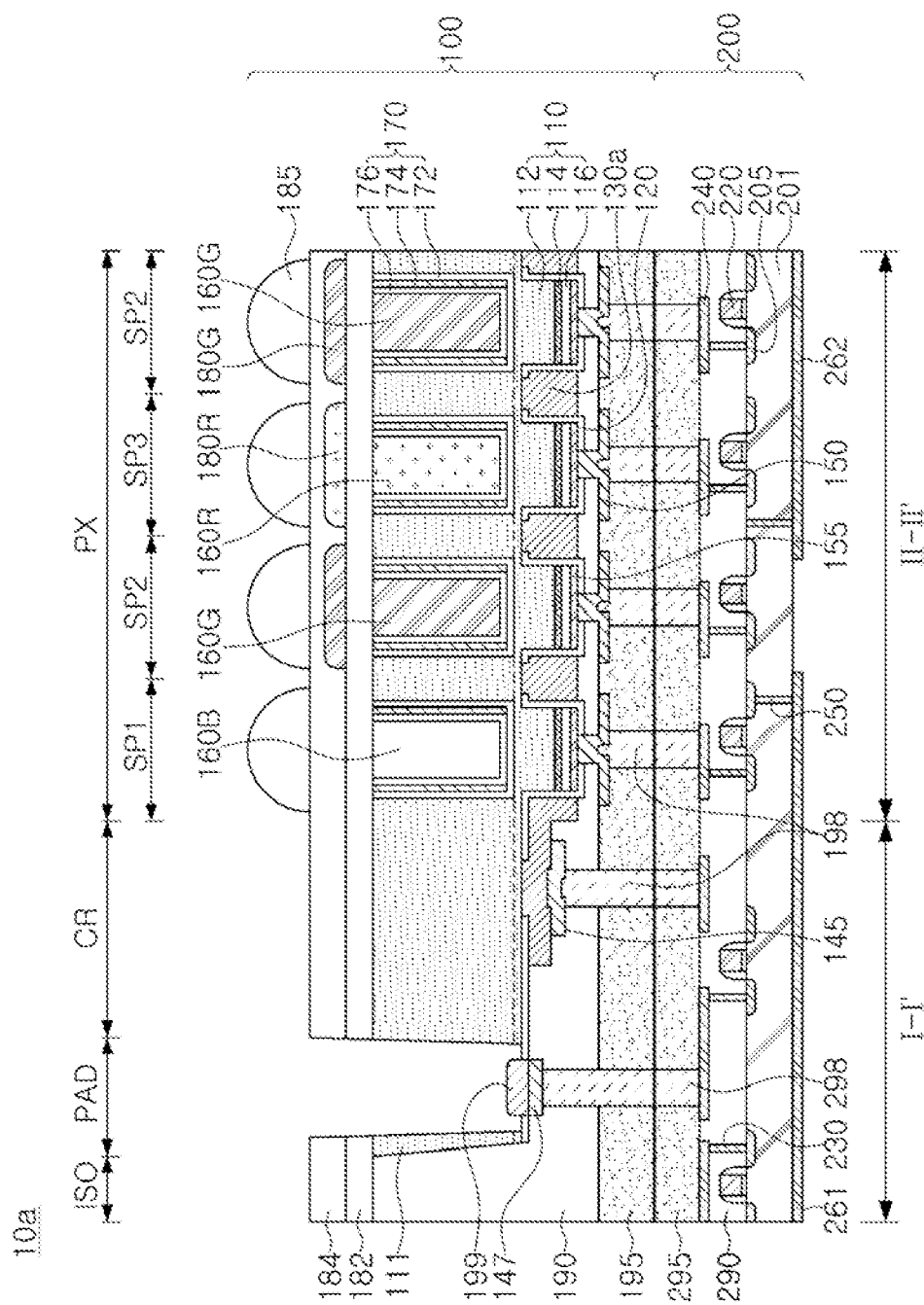
FIG. 6 is a cross-sectional view schematically illustrating a display apparatus according to example embodiments.

FIG. 6 is a cross-sectional view of a display apparatus according to example embodiments. FIG. 6 illustrates a cross-section corresponding to FIG. 3.

Referring to FIG. 6, in the pixel array 100 of a display apparatus 10*a*, a first reflective electrode 130*a* may be disposed to fill between passivation layers 120 between LED cells 110. Specifically, the first reflective electrode 130*a* rata be disposed not to have a substantially uniform thickness conformally as in the embodiment of FIG. 3, but may be disposed to be formed to be relatively thick to fill a space between the LED cells 110. For example, as illustrated in FIG. 6, the first reflective electrode 130*a* may fill the entire space between the passivation layers 120 of adjacent LED cells 110 (rather than being conformal on the passivation layers 120 to define an ran inverted U shape illustrated in FIG. 3). Even in this case, the first reflective electrode 130*a* may be arranged to form lines extending along boundaries between the LED cells 110, and may be arranged to form a grid or a mesh shape. As such, in embodiments, a relative thickness, a partial shape, or the like of the first reflective electrode 130*a* may be variously changed.

Figure 7A:
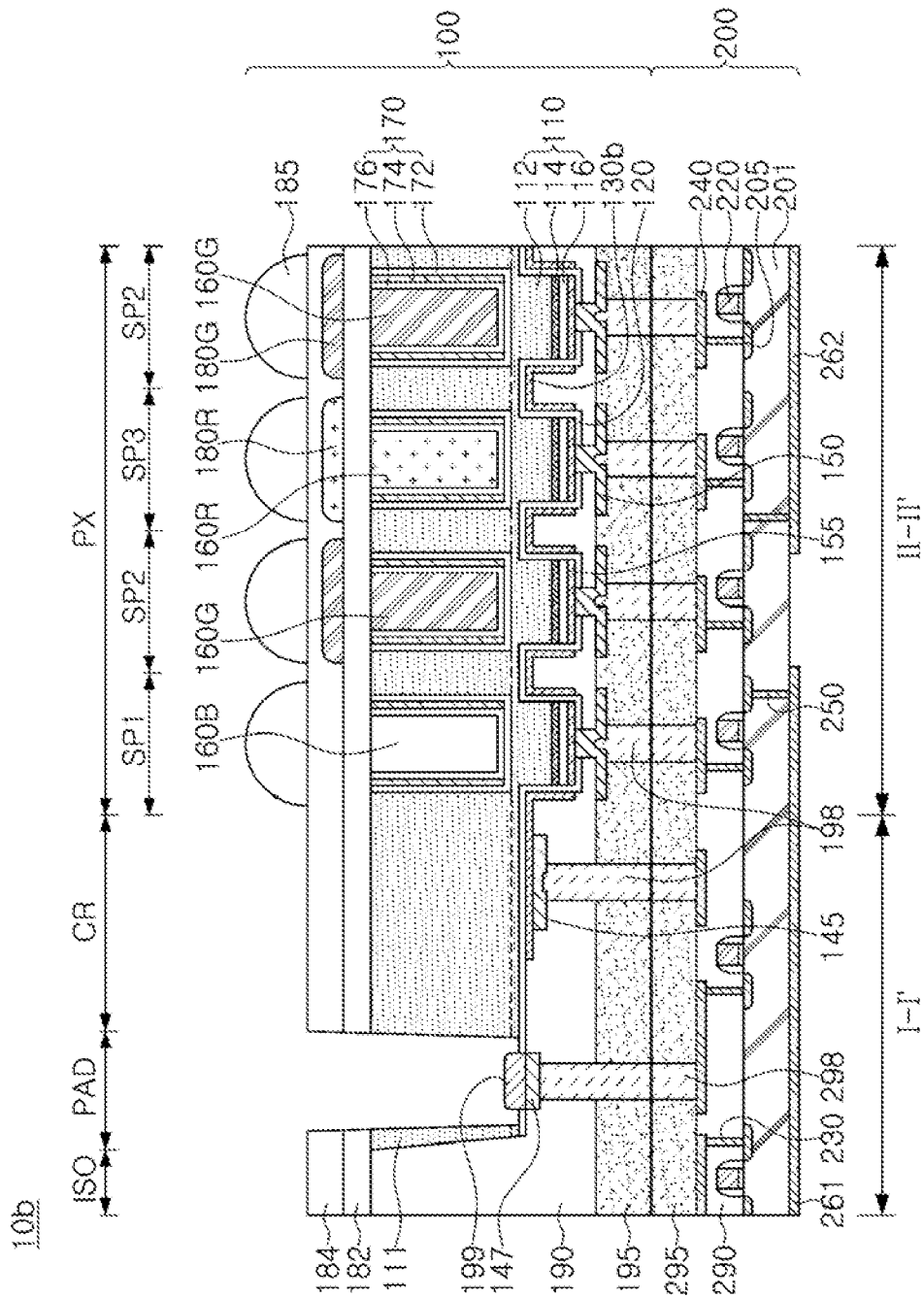
FIGS. 7A to 7C are cross-sectional views and a plan view schematically illustrating a display apparatus according to example embodiments.
Figure 7B:
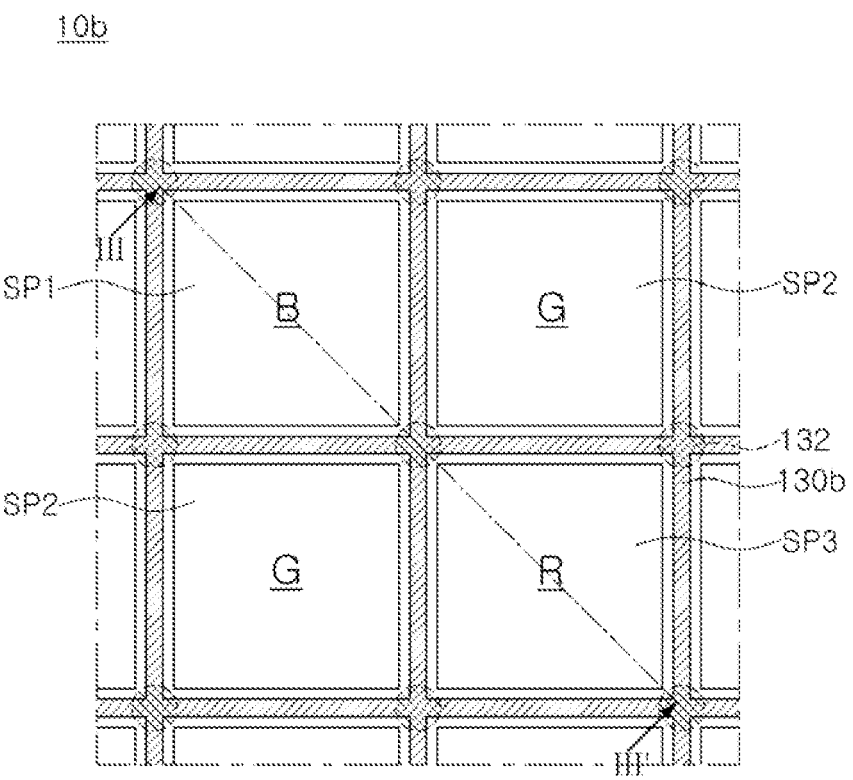
Figure 7C:
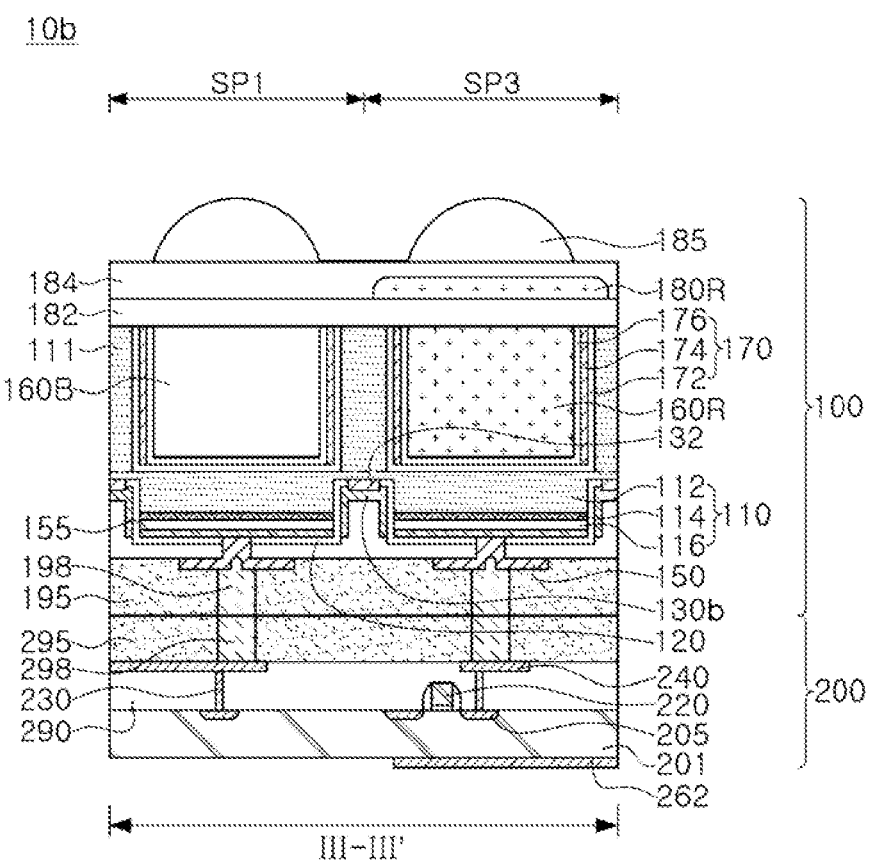

FIGS. 7A to 7C are cross-sectional views and a plan view schematically illustrating a display apparatus according, to example embodiments. FIG. 7A illustrates a cross-section corresponding to FIG. 3, FIG. 7B illustrates a plan view of one pixel, and FIG. 7C illustrates a cross-section FIG. 7B, taken along line III-III'.

Referring to FIGS. 7A to 7C, the pixel array 100 of a display apparatus 10*b* may further include an ohmic contact layer 132 connected to a first reflective electrode 130*b*. The first reflective electrode 130*b* and the ohmic contact layer 132 may constitute. e.g., an N-electrode structure together.

The first reflective electrode 130*b* may not be directly connected to the first conductivity-type semiconductor layer 112, but may be connected to the first conductivity-type semiconductor layer 112 through the ohmic contact layers 132. The ohmic contact layer 132 may be located in a central portion between four first to third sub-pixels SP1, SP2, and SP3, adjacent to each other, as illustrated in FIG. 7B. For example, the ohmic contact layer 132 may be disposed in a region adjacent to vertices of the four first to third sub-pixels SP1, SP2, and SP3. The ohmic contact layers 132 may be disposed outside vertices of each of the first to third sub-pixels SP1, SP2, and SP3. According to FIG. 7C, the ohmic contact layers 132 may be interposed between the first conductivity-type semiconductor layer 112 and the first reflective electrode 130*b*. According to this embodiment, even when it is difficult to form the first reflective electrode 130*b* to be directly connected to the first conductivity-type semiconductor layer 112 in all regions, the ohmic contact layers 132 may be disposed in regions between the first to third sub-pixels SP1, SP2, and SP3 that may be relatively wide regions in a diagonal direction, to secure electrical connection.

The ohmic contact layers 132 may include a highly reflective metal, e.g., at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), or gold (Au). The ohmic contact layers 132 may include the same or a different material from contact layers 155. For convenience of description, the ohmic contact layers 132 may be referred to as a first contact layer, and the contact layers 155 may be referred to as a second contact layer.

Figure 8:
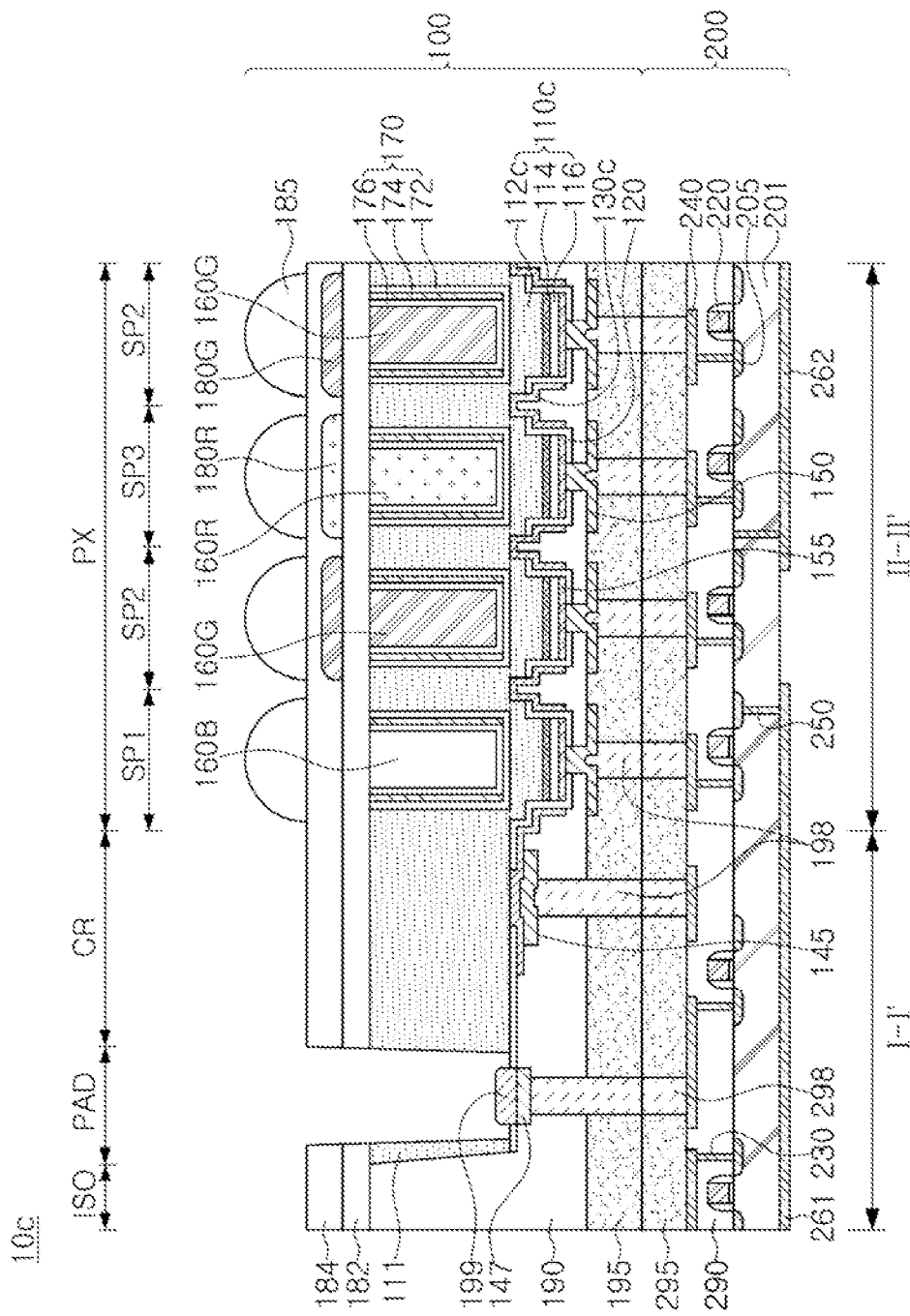
FIG. 8 is a cross-sectional view schematically illustrating a display apparatus according to example embodiments.

FIG. 8 is a cross-sectional view of a display apparatus according to example embodiments. FIG. 8 illustrates a cross-section corresponding to FIG. 3.

Referring to FIG. 8, in the pixel array 100 of a display apparatus 10c, shapes of first conductivity-type semiconductor layers 112c of LED cells 110c and a shape of a first reflective electrode 130c may be different from those illustrated in FIG. 3.

In detail, between the LED cells 110c, the first conductivity-type semiconductor layers 112c may be separated from each other. In each of the LED cells 110c, the first conductivity-type semiconductor layer 112c may have an outwardly protruding region, and the protruding region may be in contact with the first reflective electrode 130c through side surfaces thereof. In embodiments, the shapes of the side surfaces of the first conductivity-type semiconductor layer 112c, further protruding, compared to a side surface of an active layer 114 and a side surface of a second conductivity-type semiconductor layer 116, may be variously changed. In this embodiment, a level of an uppermost surface of the first reflective electrode 130c may be substantially identical to a level of a lower surface of the partition reflective layer 170.

Also in this embodiment, the first reflective electrode 130c may have a grid shape, and may be disposed as a single layer. Therefore, a portion of the first reflective electrode 130c extending into a connection region CR may also be connected to end portions of lines of the first reflective electrode 130c extending in the grid shape in a region not illustrated. In FIG. 8, the first reflective electrode 130c is illustrated as being connected to on upper semiconductor layer 111 in the connection region CR, but is not limited thereto. In some embodiments, the first reflective electrode 130c in the connection region CR may be disposed to be spaced apart from the upper semiconductor layer 111 by the passivation layer 120.

Figure 9A:
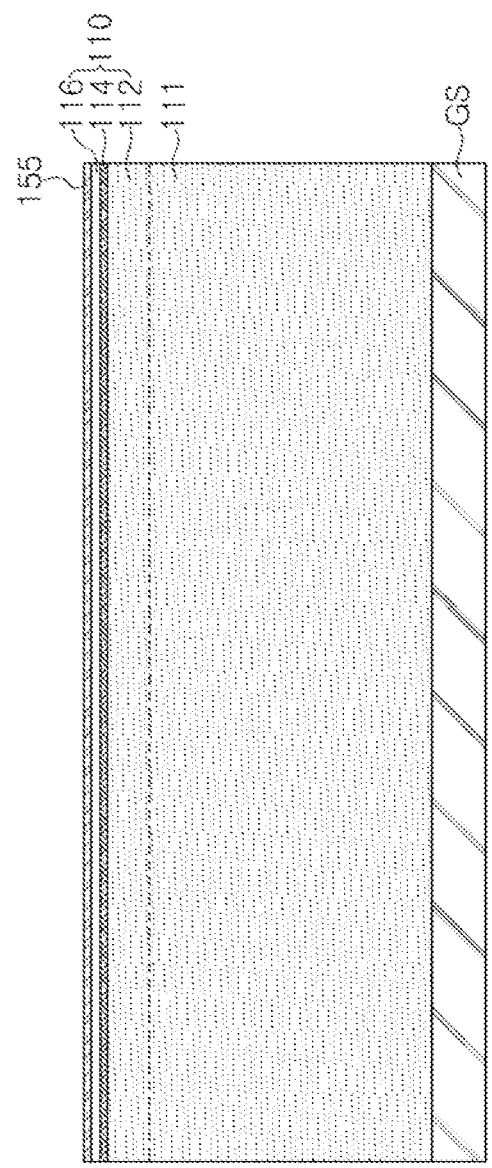
FIGS. 9A to 9O are cross-sectional views of stages in a method of manufacturing a display apparatus according to example embodiments.

FIGS. 9A to 9O are cross-sectional views of stages in a method of manufacturing a display apparatus according to example embodiments. FIGS. 9A to 9O illustrate a method of manufacturing the display apparatus according to the embodiment of FIG. 3.

Referring to FIG. 9A, the upper semiconductor layer 111, the first conductivity-type semiconductor layer 112, the active layer 114, and the second conductivity-type semiconductor layer 116 may be sequentially formed on a growth substrate GS, and the contact layer 155 may be formed.

The growth substrate OS may be for nitride single crystal growth, and include, e.g., at least one of sapphire, Si, SiC, $MgAl_2O_4$, MgO, $LiAlO_2$, $LiGaO_2$, or GaN. In embodiments, to improve crystallinity and light extraction efficiency of semiconductor layers the growth substrate GS may have a concave-convex structure on at least a portion of an upper surface thereof. In this case, a concave-convex structure may be formed even in layers grown thereon.

The upper semiconductor layer 111, the first conductivity-type semiconductor layer 112, the active layer 114, and the second conductivity-type semiconductor layer 116 may be formed by, e.g., a metal organic chemical vapor deposition (MOCVD) process, a hydride vapor phase epitaxy (HVPE) process, or a molecular beam epitaxy (MBE) process. The first conductivity-type semiconductor layer 112 may be an N-type nitride semiconductor layer, e.g., N-type GaN, and the second conductivity-type semiconductor layer 116 may be a P-type nitride semiconductor layer e.g., P-type GaN/ P-type AlGaN. The active layer 114 may have a multi-quantum well structure, e.g., InGaN/GaN. In some embodiments, the upper semiconductor layer 111 may include a buffer layer. In this case, the buffer layer may be for alleviating lattice defects of the first conductivity-type semiconductor layer 112, and may include an undoped nitride semiconductor, e.g., undoped GaN, undoped AlN, and undoped InGaN.

The contact layer 155 may be formed on an upper surface of the second conductivity-type semiconductor layer 116. For example, the contact layer 155 may be a highly reflective ohmic contact layer.

Figure 9B:
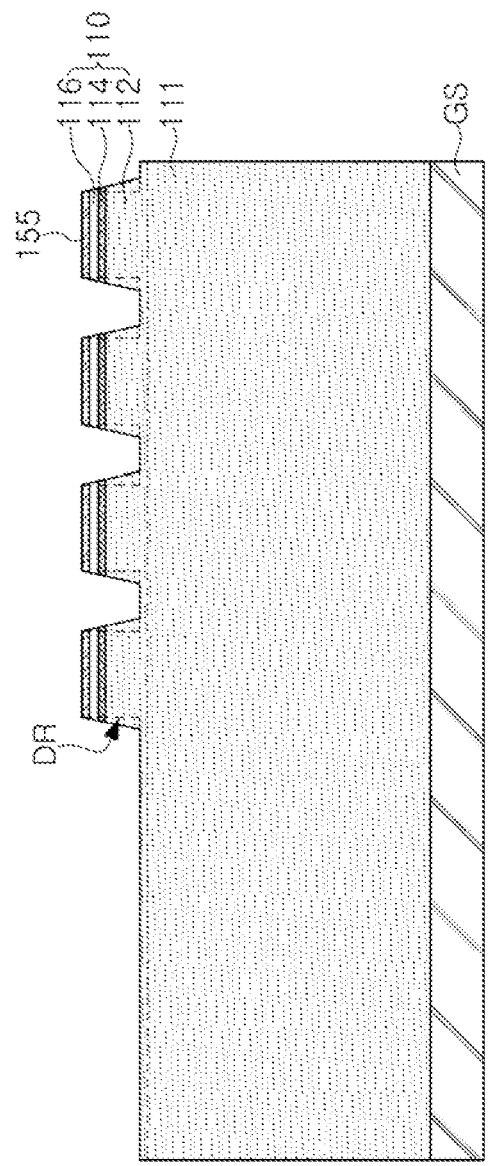

Referring to FIG. 9B, the LED cells 110 may be formed by etching a stack structure of the first conductivity-type semiconductor layer 112, the active layer 114, the second conductivity-type semiconductor 116, and the contact layer 155.

The stack structure may be partially removed by a dry etching process in this operation, and may be separated into units of first to third sub-pixels SP1, SP2, and SP3 (refer to FIG. 3). In this operation the stack structure may be etched to have an inclined side surface. In addition, damaged regions DR may be partially formed on the side surfaces of the LED cells 110 by the dry etching process.

Figure 9C:
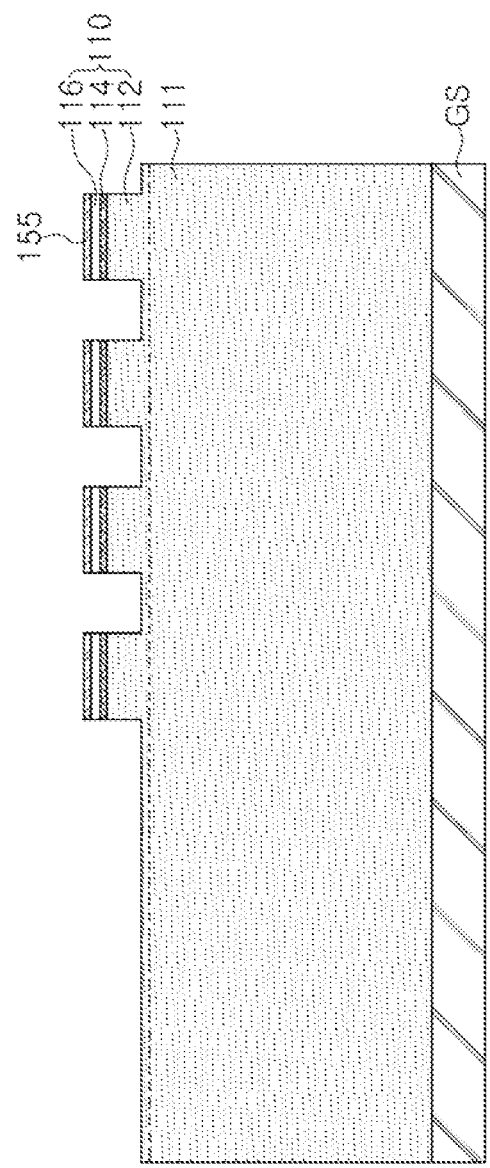

Referring, to FIG. 9C, the damaged regions DR may be removed from the LED cells 110.

The damaged regions DR may be selectively removed by, e.g., a wet etching process. In the wet etching process, only the damaged regions DR may be selectively removed by controlling process conditions, e.g., different etch selectivity between crystal planes. Therefore, an angle between an upper surface and side surfaces of the LED cells 110 may be a right angle or close to the right angle, and non-radiative recombination due to the damaged regions DR may be reduced to improve luminance.

Figure 9D:
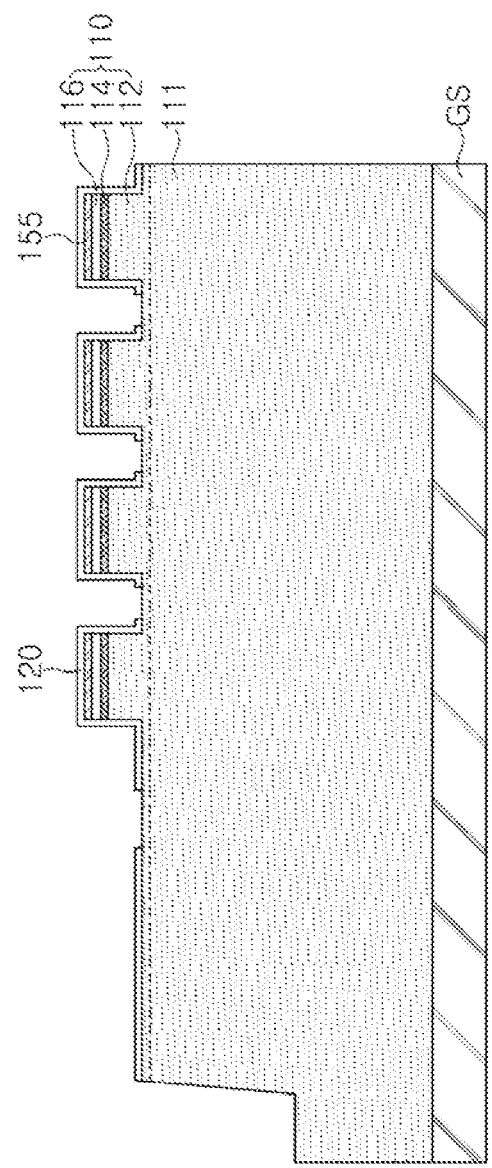

Referring to FIG. 9D, the passivation layer 120 may be formed, and the upper semiconductor layer 111 may be partially removed from an edge region ISO.

After the passivation layer 120 is formed on an upper surface of the stack structure to have a uniform thickness, the passivation layer 120 may be partially removed in regions in which the first reflective electrode 130 (refer to FIG. 3) is to be formed. The passivation layer 120 may include, e.g., at least one of $SiO_2$, SiN, SiCN, SiOC, SiON, or SiOCN. The passivation layer 120 may be conformally formed, and thus, may have a substantially uniform thickness.

In the edge region ISO, a semiconductor layer constituting the upper semiconductor layer 111 and the first conductivity-type semiconductor layer 112 may be removed to have a predetermined depth. The edge region ISO may be a region to be cut in a subsequent process, and may be a region for separating modules. Therefore, to prevent occurrence of cracks in the cutting or dicing process, the semiconductor layer may be partially removed in this operation.

Figure 9E:
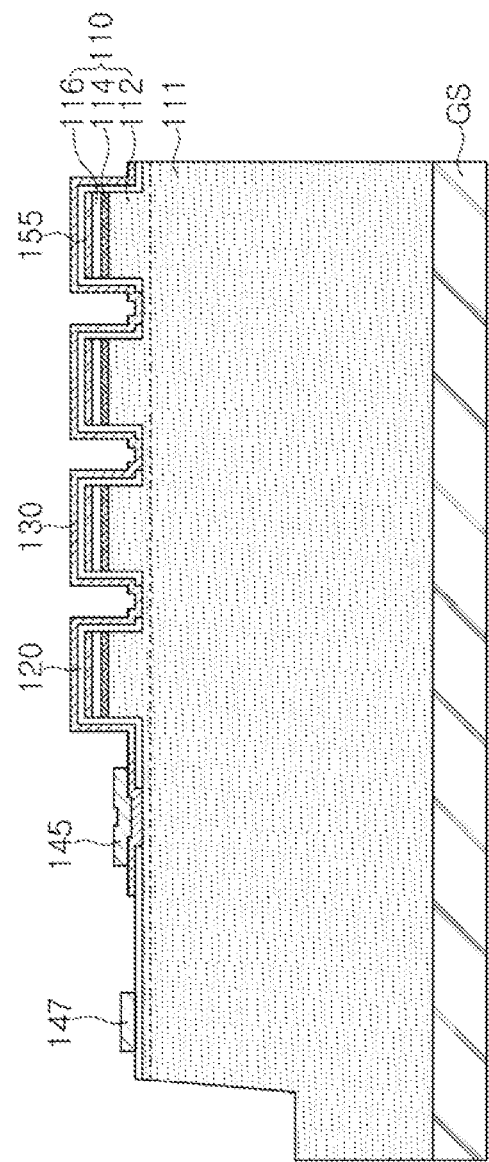

Referring to FIG. 9E, the first reflective electrode 130, the common electrode 145, and the first pad electrode 147 may be formed.

First, the first reflective electrode 130 may be conformally formed on the passivation layer 120 and the first conductivity-type semiconductor layer 112. Therefore, the first reflective electrode 130 may have a substantially uniform thickness. The first reflective electrode 130 may be formed in a region in which the pixels PX of FIG. 3 are disposed, and in the connection region CR.

Next, the common electrode 145 and the first pad electrode 147 may he respectively formed in the connection region CR and the connection pad PAD of FIG. 3. The common electrode 145 may be formed on the first reflective electrode 130, and the first pad electrode 147 may be formed on the passivation layer 120. The common electrode 145 and the first pad electrode 147 may be formed together by the same process. The first reflective electrode 130, the common electrode 145, and the first pad electrode 147 may include a conductive material, e.g., a metal.

Figure 9F:
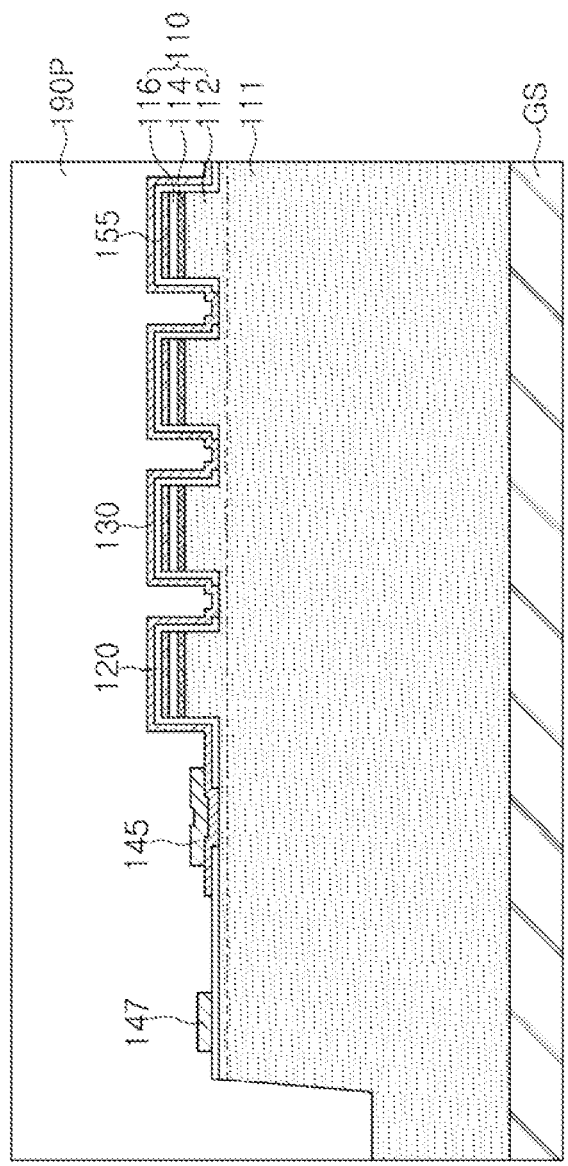

Referring to FIG. 9F, a preliminary interconnection insulating layer 190P may be formed. The preliminary interconnection insulating layer 190P may be formed to cover all structures, formed in the previous operations, including the first reflective electrode 130. For example, the preliminary interconnection insulating layer 190P may be a low dielectric material, e.g., silicon oxide.

Figure 9G:
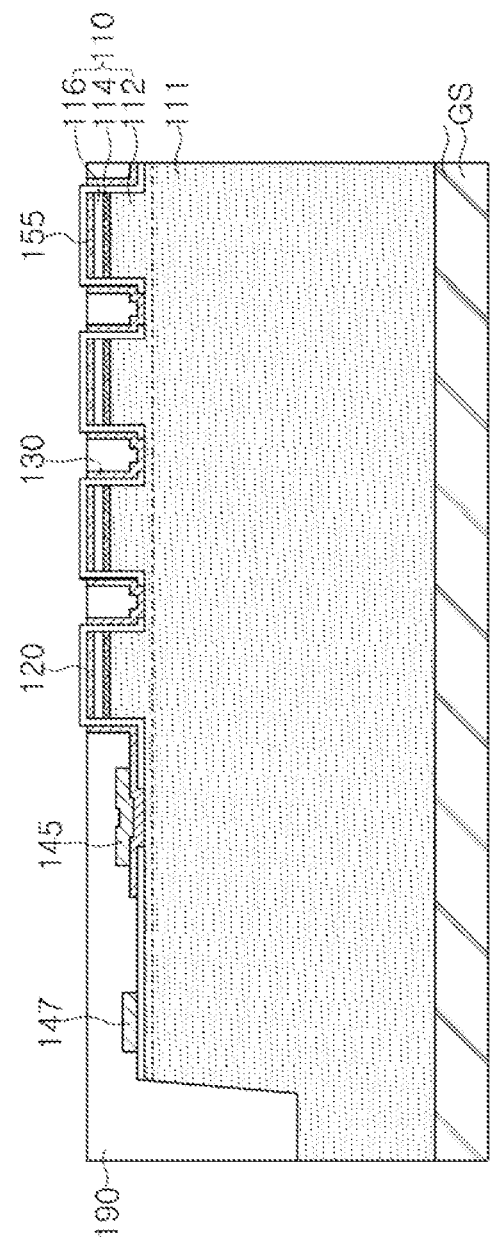

Referring to FIG. 9G, the preliminary interconnection insulating layer 190P may be partially removed to form the interconnection insulating layer 190. For example, the preliminary interconnection insulating layer 190P may be partially removed from the top using a planarization process, e.g., a chemical mechanical polishing (CMP) process or an etch-back process. In the operation of removing the preliminary interconnection insulating layer 190P, the first reflective electrode 130 may also be removed from the upper surfaces of the LED cells 110, and may remain only on the side surfaces of the LED cells 110.

Figure 9H:
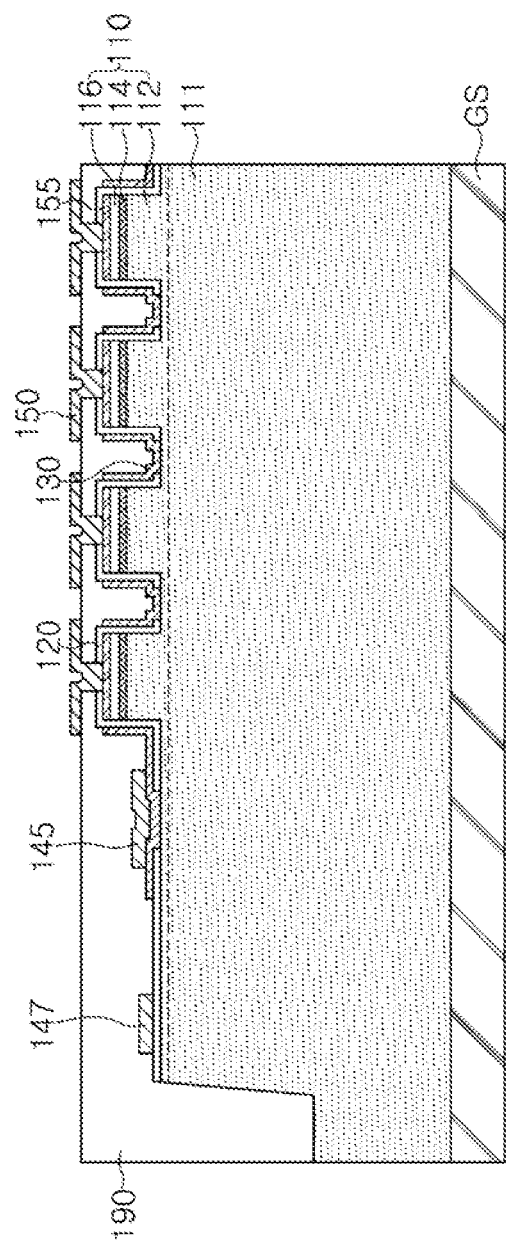

Referring to FIG. 9H, the second reflective electrodes 150 connected to the contact layers 155 may be formed.

First, the interconnection insulating layer 190 may be additionally formed, and contact holes passing through the interconnection insulating layer 190 and the passivation layer 120 to expose the contact layers 155 may be formed. By filling the contact holes with a conductive material, the second reflective electrodes 150 filling the contact holes and extending onto the upper surface of the interconnection insulating layer 190 may be formed.

Figure 9I:
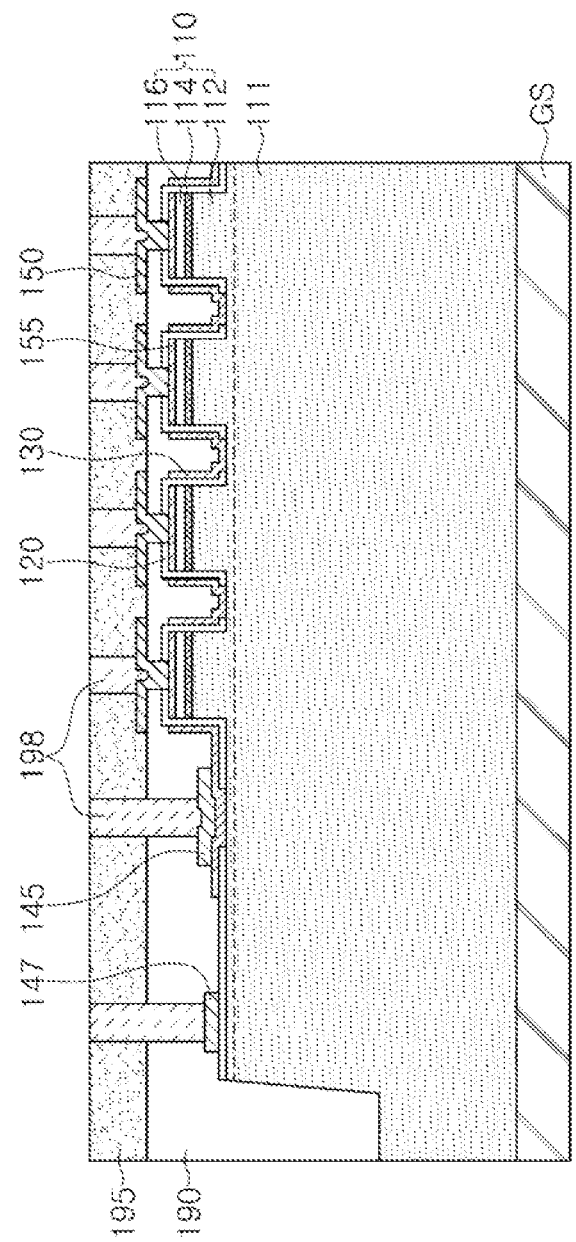

Referring to FIG. 9I, the second bonding insulating layer 195 may be formed on the second reflective electrodes 150, and the second bonding electrodes 198 may be formed.

The second bonding insulating layer 195 may include the same material as or a different material from the interconnection insulating layer 190. Also, even when the second bonding insulating layer 195 includes a different material from that of the interconnection insulating layer 190, in embodiments, a thickness of the second bonding insulating layer 195 may be variously changed within a scope in which the second bonding insulating layer 195 constitutes an upper surface of the pixel array 100 (FIG. 3).

The second bonding electrodes 198 may be prepared by forming via holes passing through the second bonding insulating layer 195 and the interconnection insulating layer 190 and then filling the via holes with a conductive material. The second bonding electrodes 198 may be formed to be connected the second reflective electrodes 150, the common electrode 145, and the first pad electrode 147.

Figure 9J:
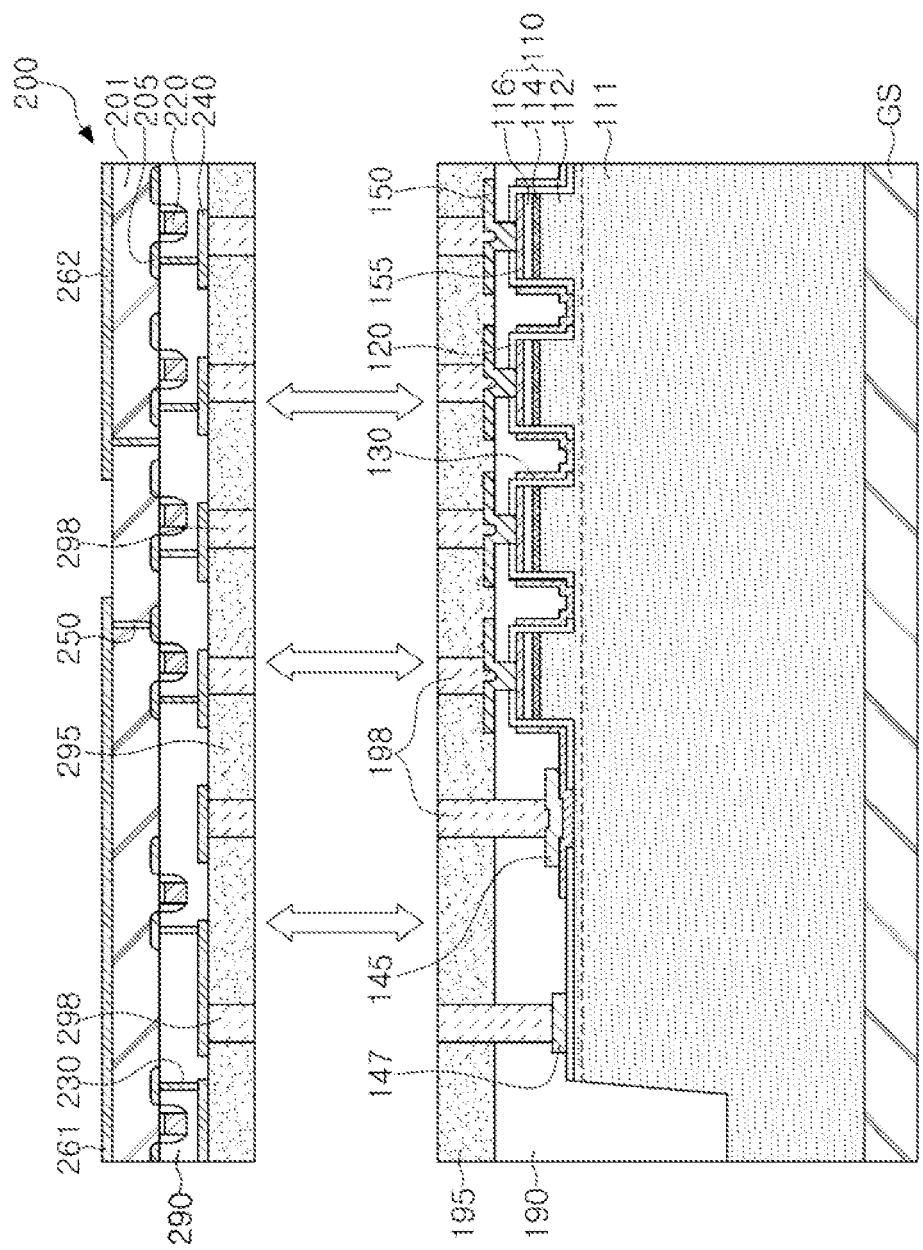

Referring to FIG. 9J a structure including the LED cells 110, and the circuit substrate 200 may be bonded.

First, the circuit substrate 200 may be prepared by a separate process. The structure and the circuit substrate 200 may be bonded on a wafer level by a wafer bonding method, e.g., the hybrid bonding described above. First bonding electrodes 298 may be bonded to the second bonding electrodes 198, and the first bonding insulating layer 295 may be bonded to the second bonding insulating layer 195. Therefore, the structure including the LED cells 110 and the circuit substrate 200 may be connected without an adhesive layer.

Figure 9K:
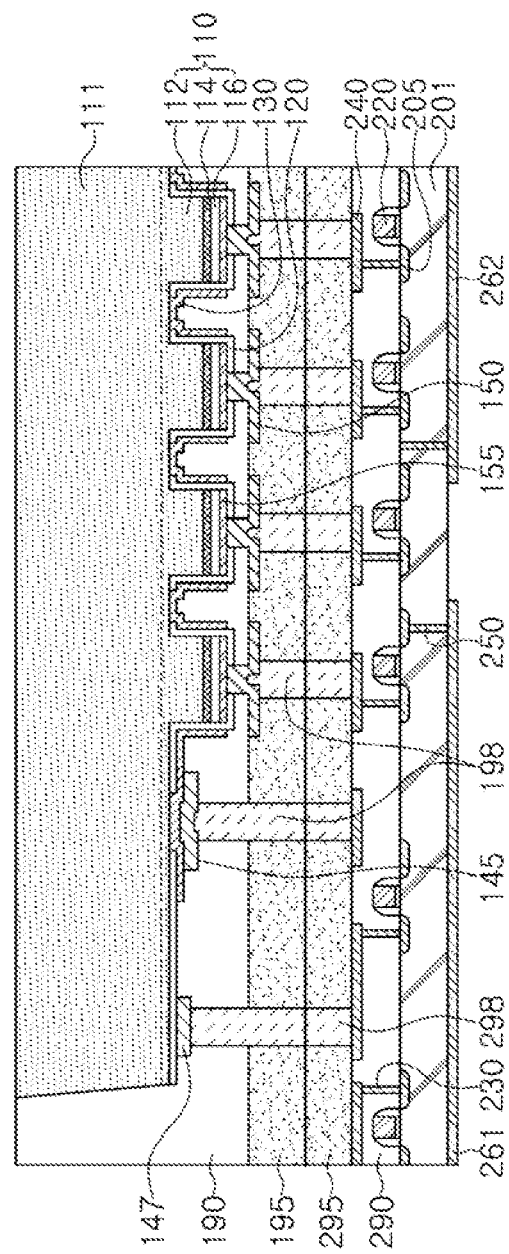

Referring to FIG. 9K, the growth substrate GS may be removed from the upper semiconductor layer 111, and the upper semiconductor layer 111 may be partially removed. In the following drawings, for better understanding, the structure including the LED cells 110 is illustrated as having a bonded state in a mirror image of the structure illustrated in FIG. 9J.

The growth substrate GS may be removed by various processes, e.g., a laser lift-off process, a mechanical polishing process, a mechanical chemical polishing process, or an etching process. The upper semiconductor layer 111 may be partially removed to reduce the predetermined thickness using, e.g., a polishing process such as CMP. The upper semiconductor layer 111 may be removed, e.g., to a level corresponding to a height of upper surfaces of wavelength converters 160R, 160G, and 160B (see FIG. 3), and may be removed not to remain in the edge region ISO (see FIG. 3).

Figure 9L:
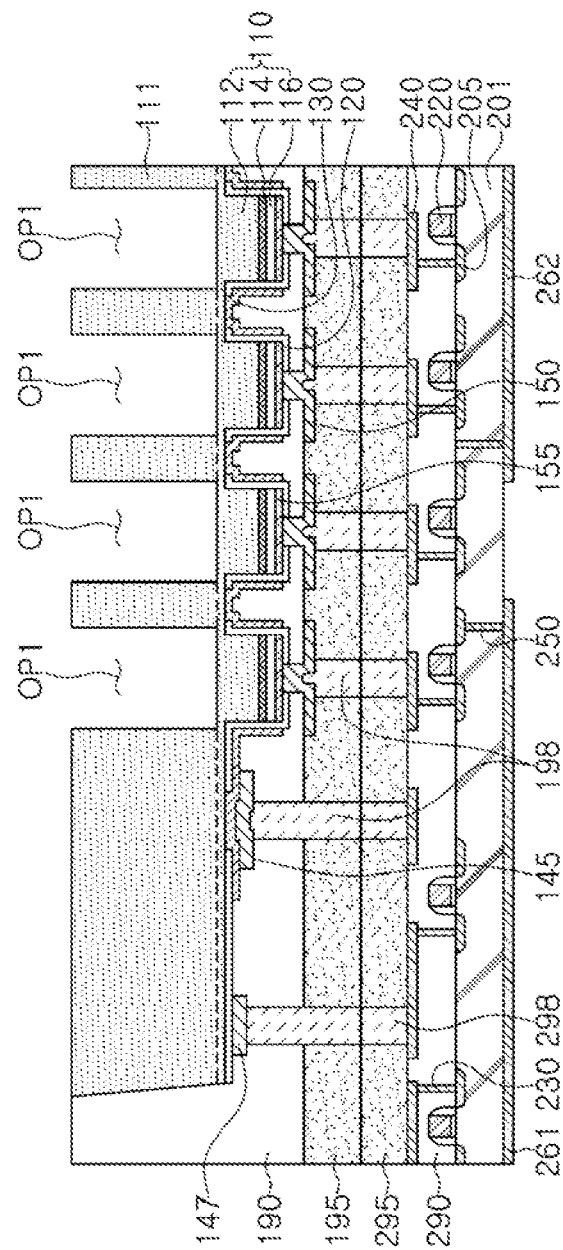

Referring to FIG. 9L, first openings OP1 may be formed. in the upper semiconductor layer 111.

The first openings OP1 may be formed by removing the upper semiconductor layer 111 in a region in which wavelength converters 160R, 160G, and 160B (FIG. 3) are disposed. In this embodiment, in this operation, the first openings OP1 may be formed such that the first conductivity-type semiconductor layer 112 is not completely separated between the LED cells 110. Therefore, the first conductivity-type semiconductor layer 112 may be continuously disposed between an upper surface of the first reflective electrode 130 and bottom surfaces of the first openings OP1.

Figure 9M:
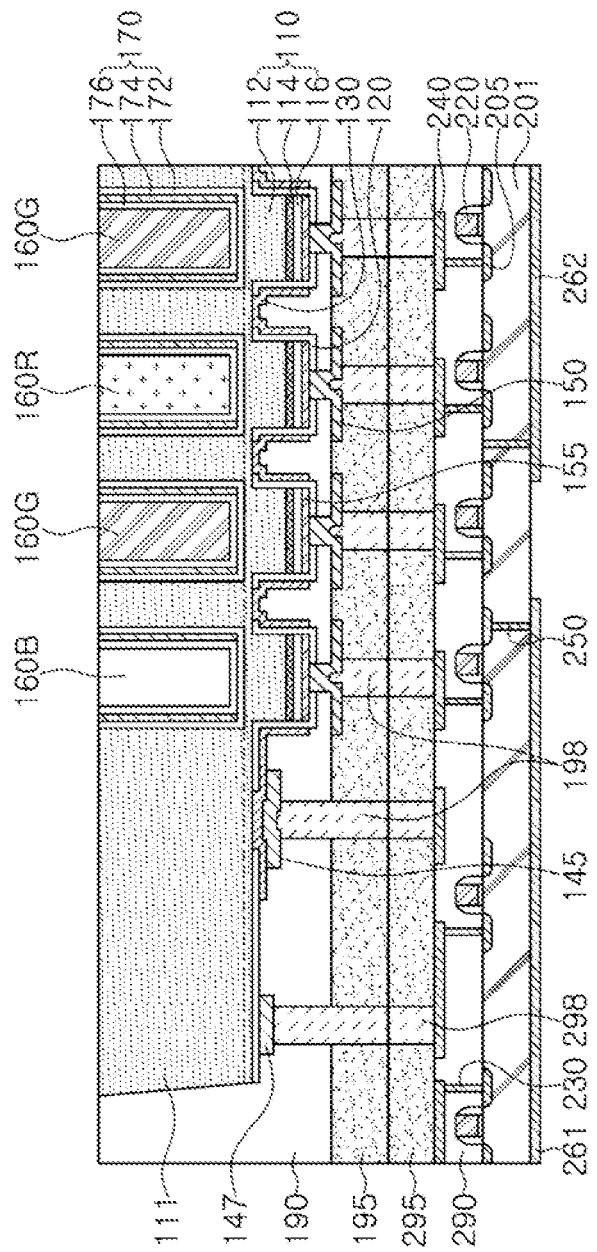

Referring to FIG. 9M, the partition reflective layers 170 and the wavelength converters 160R, 160G, and 160B may be formed in the first openings OP1. The partition reflective layers 170 may be prepared by forming the first partition insulating layer 172 and the partition metal layer 174, removing the partition metal layer 174 from the bottom surfaces of the first openings OP1, and then forming the second partition insulating layer 176.

The third wavelength converter 160B may be prepared by forming a transparent resin on the partition reflective layer 170, and the first and second wavelength converters 160G, and 160B may be prepared by forming a transparent resin mixed with a wavelength conversion material. The wavelength conversion material may convert blue light into red light and green light in the first and second wavelength converters 160R and 160G, respectively. The transparent resin may include, e.g., a silicone resin or an epoxy resin. Alternatively, according; to embodiments, the wavelength converters 160R, 160G, and 160B, may be formed of silicon oxide, e.g., $SiO_2$, instead of the transparent resin.

Figure 9N:
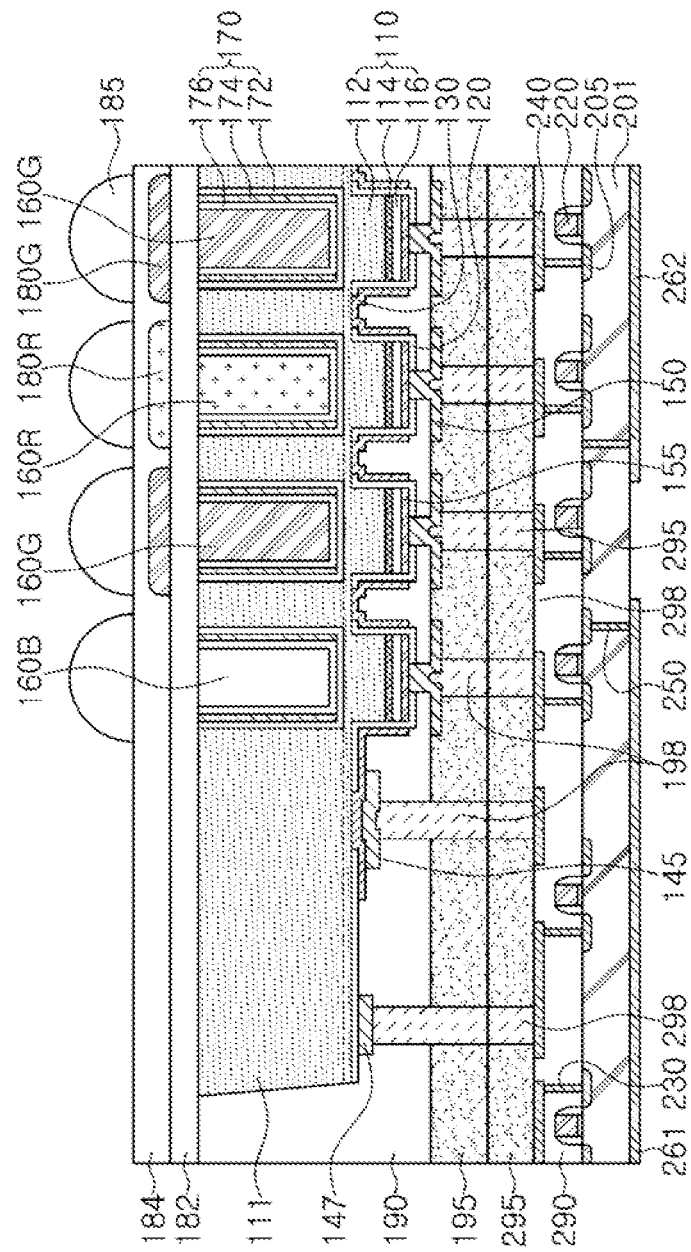
Figure 90:
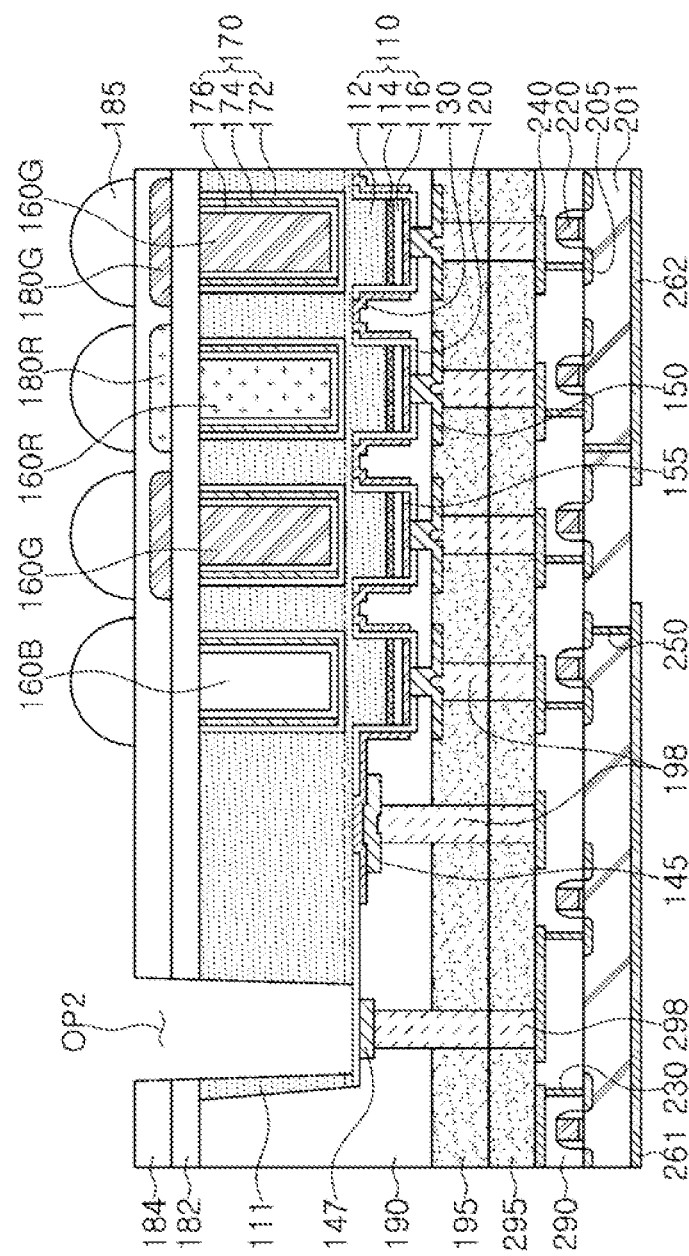

Referring to FIG. 9N, the color filters 180R and 180G and the microlenses 185 may be formed on the wavelength converters 160R, 160G, and 160B.

First, the encapsulation layer 182 may be formed on the wavelength converters 160R, 160G, and 160B to protect the wavelength converters 160R, 160G, and 160B, e.g., from moisture, oxygen, or the like. The color filters 180R and 180G may be formed on the first and second wavelength converters 160R and 160G, respectively. In some embodiments, the color filters 180R and 180G may also be formed on the third wavelength converter 160B. Next, the planarization layer 184 covering the color filters 180R and 180G may be formed, and the microlenses 185 may be formed.

Referring to FIG. 9O, the upper semiconductor layer 111 and the first conductivity-type semiconductor layer 112 may be removed from the first pad electrode 147 to form a second opening OP2. The second opening OP2 may be formed to expose the passivation layer 120 on the first pad electrode 147 in the connection pad PAD of FIG. 3.

Next, referring to FIG. 3, after partially removing the passivation layer 120 exposed through the second opening OP2, the second pad electrode 199 may be formed and adjacent modules may be diced in the edge region ISO, to complete manufacturing of the display apparatus 10.

Figure 10:
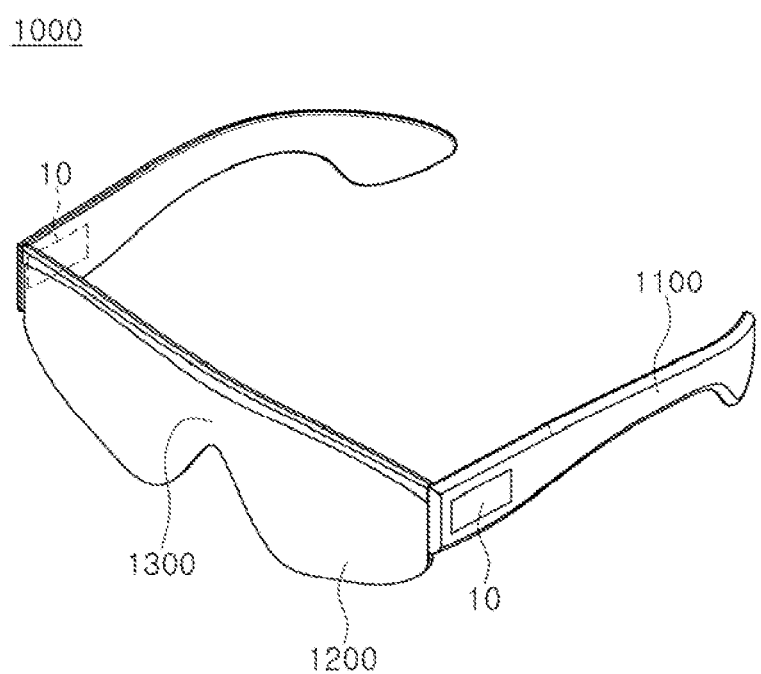
FIG. 10 is a conceptual diagram of an electronic device including a display apparatus according to example embodiments.

FIG. 10 is a conceptual diagram illustrating an electronic device including a display apparatus according to example embodiments.

Referring to FIG. 10, an electronic device 1000 may be a glasses-type display that may be a wearable device. The electronic device 1000 may include a pair of temples 1100, a pair of light coupling lenses 1200, and a bridge 1300. The electronic device 1000 may further include a display apparatus 10 including an image generator.

The electronic device 1000 may be a head-mounted, glasses-type, or goggles-type virtual reality (VR) device, for providing virtual reality or providing a virtual image and an external real landscape together, an augmented reality (AR) device, or a mixed reality (MR) device.

The temples 1100 may extend in one direction. The temples 1100 may be spaced apart from each other, and may extend in parallel. The temples 1100 may be folded to face the bridge 1300. The bridge 1300 may be provided between the light coupling lenses 1200, to connect the light coupling lenses 1200 to each other. The light coupling lenses 1200 may include a light guide plate, respectively. The display apparatus 10 may be disposed on each of the temples 1100, and may generate an image on the light coupling lenses 1200. The display apparatus 10 may be a display apparatus according to the embodiments described above with reference to FIGS. 1 to 8.

By way of summation and review, an aspect of the present disclosure provides a high-efficiency display apparatus, which may be manufactured by a simplified process. That is, according to embodiments, a display device may include a grid-shaped reflecting electrode, e.g., an n-reflecting electrode, with an inverted U-shaped cross-section along facing side surfaces of adjacent LED cells, and with a top surface of the inverted U-shaped cross-section overlapping a partition structure, e.g., formed of a GaN layer. In addition, the display apparatus may have a structure in which a circuit substrate and a pixel array are bonded by hybrid bonding, and may have optimized structures of a common electrode and a pad electrode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus comprising:
 a circuit substrate including driving circuits and first bonding electrodes; and
 a pixel array on the circuit substrate, the pixel array including:
 light emitting diode (LED) cells constituting pixels, each of the LED cells including a first conductivity-type semiconductor layer, an active layer, and a second conductivity-type semiconductor layer, sequentially stacked,
 second bonding electrodes bonded to the first bonding electrodes,
 wavelength converters on upper surfaces of the LED cells,
 an upper semiconductor layer on the LED cells, the upper semiconductor layer having a partition structure surrounding side surfaces of the wavelength converters and separating the wavelength converters from each other,
 a passivation layer extending from lower surfaces of the LED cells to cover side surfaces of the LED cells,
 a first reflective electrode on the side surfaces of the LED cells, the first reflective electrode being spaced apart from the LED cells by the passivation layer, extending into a region between the LED cells,
 second reflective electrodes on the lower surfaces of the LED cells and connected to the second conductivity-type semiconductor layers, respectively,
 a common electrode on at least one side of the LED cells,
 a pad electrode outside the LED cells and electrically connected to the driving circuits, and
 microlenses on the wavelength converters,
 wherein each of the microlenses has a diameter greater than a width of each of the LED cells.

2. The display apparatus as claimed in claim 1, wherein:
 the LED cells are arranged in columns and rows, and
 the first reflective electrode is a single layer having a Ho shape.

3. The display apparatus as claimed in claim 2, wherein:
 the LED cells include a first LED cell and a second LED cell adjacent to each other in one direction, and
 the first reflective electrode extends from one side surface of the first LED cell to an opposite side surface of the second LED cell.

4. The display apparatus as claimed in claim 1, wherein the first reflective electrode does not overlap the active layer and the second conductivity-type semiconductor layer of each of the LED cells in a direction perpendicular to the upper surfaces of the LED cells.

5. The display apparatus as claimed in claim 1, wherein the first reflective electrode fills a space between adjacent ones of the LED cells.

6. The display apparatus as claimed in claim 1, wherein the upper semiconductor layer is connected to the first conductivity-type semiconductor layer, and is formed of the same material as the first conductivity-type semiconductor layer.

7. The display apparatus as claimed in claim 6, wherein the upper semiconductor layer includes an epitaxial nitride semiconductor layer.

8. The display apparatus as claimed in claim 1, wherein:
 the circuit substrate further includes a first bonding insulating layer surrounding the first bonding electrodes, the first bonding insulating layer defining an upper surface of the circuit substrate, and the pixel array further includes a second bonding insulating layer surrounding the second bonding electrodes, the second bonding insulating layer defining a lower surface of the pixel array, and the second bonding insulating layer being bonded to the first bonding insulating layer.

9. The display apparatus as claimed in claim 1, wherein:
a portion of the second bonding electrodes is connected to the second reflective electrodes, each of the portion of the second bonding electrodes having a first height, and
at least one of the second bonding electrodes is connected to the common electrode, the at least one of the second bonding electrodes having a second height greater than the first height.

10. The display apparatus as claimed in claim 1, wherein the upper semiconductor layer extends onto the common electrode.

11. The display apparatus as claimed in claim 1, wherein the first conductivity-type semiconductor layers are connected to each other between the LED cells to define a single layer.

12. The display apparatus as claimed in claim 1, wherein the pad electrode is exposed through an opening passing through the upper semiconductor layer and the first conductivity-type semiconductor layer.

13. The display apparatus as claimed in claim 1, wherein the pixel array further includes:
color filters on the wavelength converters below the microlenses.

14. The display apparatus as claimed in claim 1, wherein each of the pixels includes sub-pixels arranged in a Bayer pattern.

15. The display apparatus as claimed in claim 14, wherein the pixel array further includes an ohmic contact layer connected to the first reflective electrode, the ohmic contact layer being positioned in a central portion between four adjacent ones of the sub-pixels.

16. The display apparatus as claimed in claim 1, wherein an angle between the lower surfaces and the side surfaces of the LED cells is about 85 degrees to about 95 degrees.

17. A display apparatus, comprising:
a circuit substrate including driving circuits; and
a pixel array on the circuit substrate, the pixel array including:
a plurality of pixels,
light emitting diode (LED) cells constituting the plurality of pixels, each of the LED cells including a first conductivity-type semiconductor layer, an active layer, and a second conductivity-type semiconductor layer, sequentially stacked,
wavelength converters on upper surfaces of the LED cells,
a first reflective electrode extending from side surfaces of the LED cells to an outside of the LED cells, the first reflective electrode extending between facing ones of the side surfaces of adjacent ones of the LED cells and having a grid shape along a region between the adjacent ones of the LED cells, and
second reflective electrodes on lower surfaces of the LED cells and connected to the second conductivity-type semiconductor layers, respectively
wherein the first reflective electrode is connected to the first conductivity-type semiconductor layers in the region between the adjacent ones of the LED cells.

18. The display apparatus as claimed in claim 17, wherein the first reflective electrode includes a plurality of lines extending in an inverted U-shape.

19. A display apparatus, comprising:
a circuit substrate including driving circuits and first bonding electrodes; and
a pixel array on the circuit substrate, the pixel array including:
light emitting diode (LED) cells constituting a plurality of pixels, each of the LED cells including a first conductivity-type semiconductor layer, an active layer, and a second conductivity-type semiconductor layer, sequentially stacked,
a first reflective electrode in a region between adjacent ones of the LED cells without vertically overlapping the LED cells,
second reflective electrodes connected to the second conductivity-type semiconductor layers, each of the second reflective electrodes being below a lower surface of a corresponding one of the LED cells to vertically overlap the LED cells,
wavelength converters on upper surfaces of the LED cells,
an upper semiconductor layer having a partition structure surrounding side surfaces of the wavelength converters and separating the wavelength converters from each other,
a common electrode on at least one side of the LED cells, and
second bonding electrodes bonded to the first bonding electrodes, a first portion of the second bonding electrodes outside the LED cells being connected to the first reflective electrode through the common electrode, and a second portion of the second bonding electrodes being directly connected to the second reflective electrodes.

* * * * *